(12) United States Patent
Hastings et al.

(10) Patent No.: US 8,218,274 B2
(45) Date of Patent: Jul. 10, 2012

(54) DIRECT CURRENT ARC FAULT CIRCUIT INTERRUPTER, DIRECT CURRENT ARC FAULT DETECTOR, NOISE BLANKING CIRCUIT FOR A DIRECT CURRENT ARC FAULT CIRCUIT INTERRUPTER, AND METHOD OF DETECTING ARC FAULTS

(75) Inventors: Jerome K. Hastings, Sussex, WI (US); Joseph C. Zuercher, Brookfield, WI (US); Birger Pahl, Milwaukee, WI (US); Brian Thomas Pier, Milwaukee, WI (US); Edward T. Gisske, Mount Horeb, WI (US)

(73) Assignee: Eaton Corporation, Cleveland, OH (US)

( * ) Notice: Subject to any disclaimer, the term of this patent is extended or adjusted under 35 U.S.C. 154(b) by 289 days.

(21) Appl. No.: 12/637,873

(22) Filed: Dec. 15, 2009

(65) Prior Publication Data

US 2011/0141644 A1    Jun. 16, 2011

(51) Int. Cl.
*H02H 3/16* (2006.01)
(52) U.S. Cl. ............................................. 361/42; 361/44
(58) Field of Classification Search .............. 361/42–50; 136/244
See application file for complete search history.

(56) References Cited

U.S. PATENT DOCUMENTS

| 2003/0058596 | A1  | 3/2003 | MacBeth |
| 2004/0027749 | A1* | 2/2004 | Zuercher et al. ................. 361/62 |
| 2008/0204950 | A1  | 8/2008 | Zhou et al. |
| 2009/0161270 | A1* | 6/2009 | Beatty et al. .................... 361/42 |

FOREIGN PATENT DOCUMENTS

| DE | 19727825 A1 | 1/1999 |
| DE | 10359532 B3 | 6/2005 |
| WO | 95/25374 A1 | 9/1995 |

OTHER PUBLICATIONS

Haeberlin, H., et al., "Arc Detector for Remote Detection of Dangerous Arcs on the DC Side of PV Plants", 22nd. European Photovoltaic Solar Energy Conference, Milano, Italy, Sep. 2007, 6 pp.
European Patent Office, International Searching Authority, "Invitation to Pay Additional Fees" and "Communication Relating to the Results of the Partial International Search", Oct. 4, 2011, 8 pp.
European Patent Office, "International search report and Written Opinion", Dec. 29, 2011, 17 pp.

* cited by examiner

*Primary Examiner* — Danny Nguyen
(74) *Attorney, Agent, or Firm* — Eckert Seamans Cherin & Mellott, LLC; Kirk D. Houser

(57) ABSTRACT

A direct current arc fault circuit interrupter includes separable contacts and a trip circuit to trip open the contacts. The trip circuit includes a number of alternating current sensors structured to sense a current flowing through the separable contacts, a number of filter circuits cooperating with the AC current sensors to output a number of AC signals, a number of peak detectors cooperating with the filter circuits to output a number of peak current signals, and a processor cooperating with at least the peak detectors. The processor inputs the number of peak current signals as a plurality of peak current signals or inputs the number of peak current signals and determines the plurality of peak current signals. The processor also determines if the peak current signals exceed corresponding predetermined thresholds for a predetermined time, and responsively causes the contacts to trip open.

26 Claims, 13 Drawing Sheets

US 8,218,274 B2

DIRECT CURRENT ARC FAULT CIRCUIT INTERRUPTER, DIRECT CURRENT ARC FAULT DETECTOR, NOISE BLANKING CIRCUIT FOR A DIRECT CURRENT ARC FAULT CIRCUIT INTERRUPTER, AND METHOD OF DETECTING ARC FAULTS

BACKGROUND

1. Field

The disclosed concept pertains generally to arc fault detection and, more particularly, to direct current arc fault circuit interrupters. The disclosed concept also pertains to direct current arc fault detectors, noise blanking circuits for direct current arc fault circuit interrupters, and methods of detecting arc faults.

2. Background Information

It is believed that there is no known mechanism in photovoltaic (PV) (e.g., photovoltaic; solar electric) systems to detect arcing faults and stop strings or string arrays from generating energy under an in-circuit (series) fault or a short circuit fault (e.g., without limitation, a parallel arc), which can result in a fire. For example, fuses at the load end of a string do not prevent this fault. For example, arcs consume energy that does not transfer to an inverter or load.

Known practice places a protective device (i.e., a fuse) at the load end of a string, in one feed conductor (e.g., wire; typically the positive wire) to open when back feed currents exceed 150% of the fuse rating during back feed conditions and back feed shorts. Depending on the manufacturer, either the positive or negative feed wire will contain a protective device (i.e., a fuse). Depending on the local building codes, the system may have a grounded conductor or may be ungrounded. Some known combiner boxes include fuses on both conductors for ungrounded systems at the feed end but not at the remote end. It is believed that protective devices are not used at the PV generating modules, at the remote end of a string, or in the return conductor. It is believed that all of the connecting feed conductors between the PV generating modules and the return conductors are un-protected from arcing events or short circuits of many kinds FIG. 1 shows several parallel strings 2,4,6 of series-connected direct current (DC) electrical generating modules 8 (e.g., PV generating modules) with a protective device 10 located in the positive conductor 12 of each string. This protective device 10 is a fuse and only protects against a reverse over current when the corresponding string 2,4,6 shorts and is back fed by the other PV strings which are bussed together at the main DC bus 14 in the combiner box 16.

It is known to employ fuses for over current protection and diodes to block reverse current. It is believed that known strings and arrays of DC electrical generating modules do not provide series or parallel arc fault protection.

It is believed that fuses are essentially useless in PV power systems since such fuses are sized at 125% and typically must open at 150% of full load current, while the maximum short circuit current for PV arrays does not exceed 100% of full load current. In PV power systems, fuses protect conductors, such as wires, from over currents. Over currents can only result from a back feed condition. Forward feed currents for silicon PV modules are typically limited to about 7.5 A by the structure of the PV modules, which cannot produce more than about 7.5 A even when short circuited. Therefore, string fuses are useless for providing protection from a forward feed fault, or bus faults that occur above the string fuses.

It is believed that fuses also cannot provide protection from an arcing fault. A fuse is typically used on each string, which is a series connected number of PV modules to achieve, for example, a 600 VDC potential. The string is terminated in a central junction box commonly referred to as a combiner box.

Module DC/DC converters can turn off power to exposed connectors, but are believed to lack a detection mechanism for faults. Otherwise, there is no protection or control at the PV module and, therefore, no way to turn off the potential generated by the PV modules other than to block the light and prevent illumination of the silicon diodes of the PV module by covering the PV modules, an impractical strategy in the field.

DC/DC converters can help prevent backfed faults as they maintain voltage consistency between the voltage provided by the string and the voltage required by the DC bus to reach the maximum power point (MPP). However, there is no protection for series arcing faults or many short circuits between the positive and negative feed wires or ground.

There is room for improvement in direct current arc fault circuit interrupters.

There is also room for improvement in direct current arc fault detectors.

There is further room for improvement in methods of detecting arc faults.

SUMMARY

These needs and others are met by embodiments of the disclosed concept, which detect arcing in direct current (DC) circuits.

In accordance with one aspect of the disclosed concept, a direct current arc fault circuit interrupter comprises: separable contacts; an operating mechanism structured to open and close the separable contacts; a trip circuit cooperating with the operating mechanism to trip open the separable contacts, the trip circuit comprising: a number of alternating current sensors structured to sense a current flowing through the separable contacts, a number of filter circuits cooperating with the number of alternating current sensors to output a number of alternating current signals, a number of peak detectors cooperating with the number of filter circuits to output a number of peak current signals, and a processor cooperating with at least the number of peak detectors and the operating mechanism, the processor being structured to (a) input the number of peak current signals as a plurality of peak current signals or (b) input the number of peak current signals and determine the plurality of peak current signals, the processor also being structured to determine if the plurality of peak current signals exceed corresponding predetermined thresholds for a predetermined time, and responsively cause the operating mechanism to trip open the separable contacts.

The trip circuit may further comprise a direct current sensor structured to sense the current flowing through the separable contacts; and the processor may be further structured to detect a level shift in the sensed current employing the direct current sensor.

As another aspect of the disclosed concept, a noise blanking circuit is for a direct current arc fault circuit interrupter comprising separable contacts and a number of alternating current channels operatively associated with a plurality of alternating current signals for the separable contacts. The noise blanking circuit comprises: a direct current sensor structured to be in series with the separable contacts of the direct current arc fault circuit interrupter; and a processor cooperating with the direct current sensor, the processor being structured to input a sensed direct current signal from the direct current sensor, and disable the number of alternating current channels if a rate of change of the sensed direct current signal is greater than a first predetermined threshold or enable the number of alternating current channels if the rate of change is less than a different second predetermined threshold, which is less than the first predetermined threshold.

As another aspect of the disclosed concept, a method of detecting arc faults of a direct current string comprises: sensing an alternating current flowing through the direct current string; filtering the sensed alternating current with a number of filter circuits and outputting a number of alternating current signals; determining a plurality of peak current signals from the number of alternating current signals; and determining if the plurality of peak current signals exceed corresponding predetermined thresholds for a predetermined time, and responsively tripping the direct current string.

As another aspect of the disclosed concept, a method detects arc faults of an array comprising a plurality of direct current strings electrically connected in parallel to form the array. The method comprises: sensing an alternating current flowing through the array; filtering the sensed alternating current with a number of filter circuits and outputting a number of alternating current signals; determining a plurality of peak current signals from the number of alternating current signals; and determining if the plurality of peak current signals exceed corresponding predetermined thresholds for a predetermined time, and responsively tripping the array.

As another aspect of the disclosed concept, a direct current arc fault detector comprises: a number of alternating current sensors structured to sense a current flowing through a conductor; a number of filter circuits cooperating with the number of alternating current sensors to output a number of alternating current signals; a number of peak detectors cooperating with the number of filter circuits to output a number of peak current signals; an output; and a processor cooperating with at least the number of peak detectors and the output, the processor being structured to (a) input the number of peak current signals as a plurality of peak current signals or (b) input the number of peak current signals and determine the plurality of peak current signals, the processor also being structured to determine if the plurality of peak current signals exceed corresponding predetermined thresholds for a predetermined time, and responsively activate the output.

As another aspect of the disclosed concept, a direct current arc fault circuit interrupter comprises: separable contacts; an operating mechanism structured to open and close the separable contacts; a trip circuit cooperating with the operating mechanism to trip open the separable contacts, the trip circuit comprising: an alternating current sensor structured to sense a current flowing through the separable contacts, a broadband filter circuit cooperating with the alternating current sensor to output an alternating current signal, a peak detector cooperating with the broadband filter circuit to output a peak current signal, and a processor cooperating with at least the peak detector and the operating mechanism, the processor being structured to input and integrate the peak current signal and to determine if the integrated peak current signal exceeds a predetermined threshold for a predetermined time, and responsively cause the operating mechanism to trip open the separable contacts.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
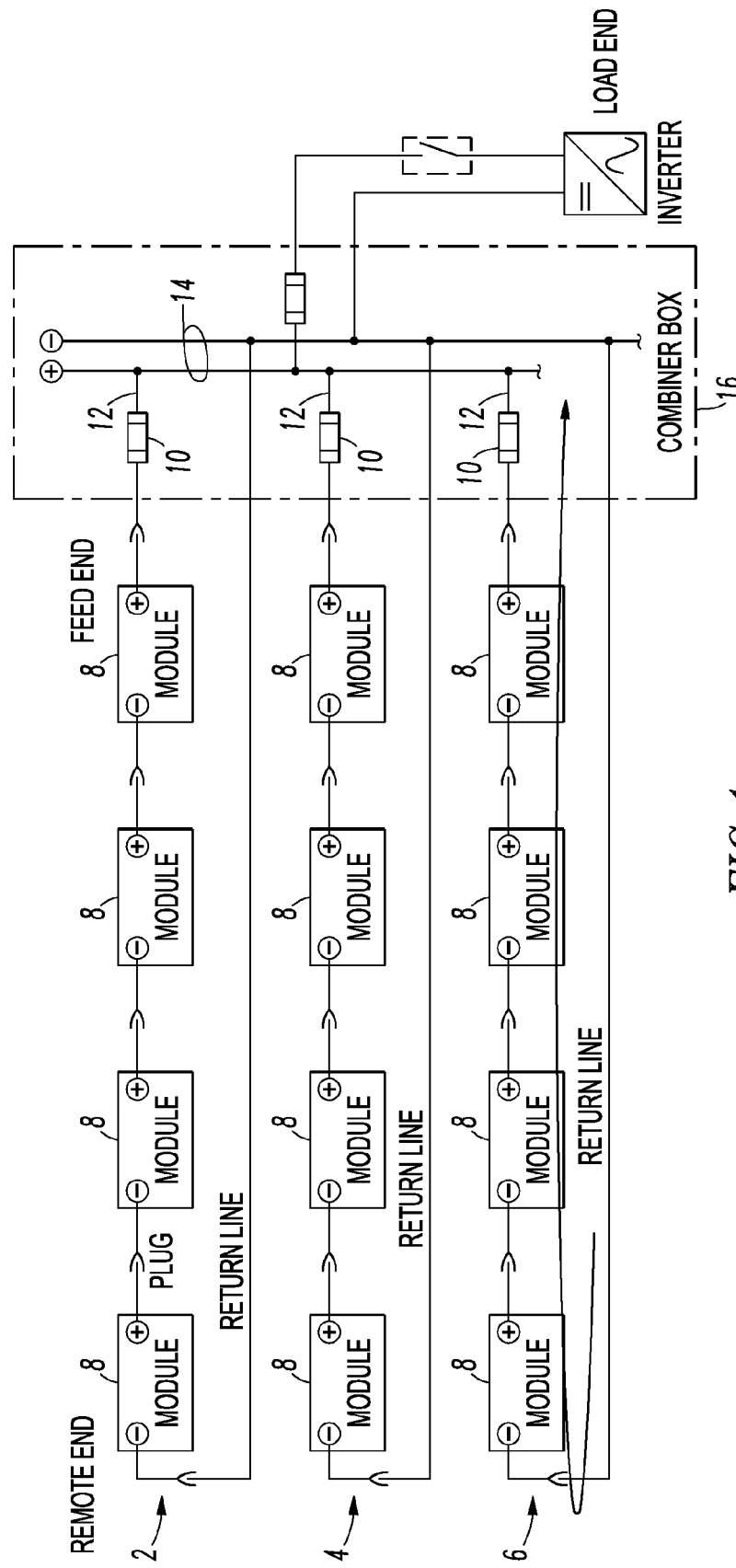
FIG. 1 is a block diagram in schematic form of a plurality of strings of direct current (DC) electrical generating modules with a single protective device for each string located in the positive conductor.

As employed herein, the term "number" shall mean one or an integer greater than one (i.e., a plurality).

As employed herein, the term "processor" means a preprogrammed, programmable or dedicated logic analog (e.g., without limitation, a number of amplifiers, filters, capacitors and/or analog timing elements) and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "short circuit" means a bolted fault or an arcing fault to the opposite polarity or to ground.

As employed herein, the term "bolted fault" means a solid or direct or suitably low impedance electrical connection to the opposite polarity or to ground, typically resulting in an increase in current flow.

As employed herein, the term "arcing fault to the opposite polarity" means an electrical connection to the opposite polarity through a conductive plasma. For example and without limitation, such arcing faults can include: (1) a metal vapor arc (or spark); (2) a plasma arc that requires a relatively hot ionized conduction path; and (3) arcing over a surface which has suffered from a deterioration of its insulating capability by way of an electrolyte contamination or carbon tracking As employed herein, the term "in-circuit arcing fault" or "in-circuit arc" means a sustained arcing break (e.g., a plasma) in series electrical connection(s), internal to a generating module, between plural generating modules, or in electrical circuits running to or from a combiner box or any other electrical junction(s), terminal(s) or connection(s). Here, series means that there is another circuit element (e.g., without limitation, an inverter) present that prevents the arc from being directly electrically connected from the power line to the return.

As employed herein, the term "open circuit" means a break without arcing in a series circuit electrical connection of a string.

As employed herein, the terms "arc fault circuit interrupter", "AFCI" and "arc fault protector" mean an arc fault detector and a number of separable contacts responsive to the arc fault detector.

As employed herein, the term "string" means a series electrical circuit connection of a plurality of electrical generating modules.

As employed herein, the term "string protector" means a protection device for a string and/or an electrical generating module of a string. The string protector includes a number of AFCI, over current and/or reverse current protection functions.

As employed herein, the term "combiner box" means a box, an enclosure or another suitable structure where one end of a plurality of strings are fused and/or protected. A combiner box electrically combines in parallel DC currents from several strings.

As employed herein, the term "direct current electrical generating module" means a photovoltaic electrical generating module, a battery or a fuel cell.

As employed herein, the term "power line" generally refers to a power conductor at the feed end of a string, which electrically connects electrical generating modules in series.

As employed herein, the term "return line" generally refers to a power conductor extending from the remote end to the feed end of a string with no electrical generating modules in series.

A photovoltaic string of generating modules is an example of a series circuit electrical connection of a plurality of electrical generating modules. An "in-circuit arc" can occur, for example, when an electrical circuit, comprised of a series circuit electrical connection of a plurality of generating modules, is opened under load creating an arc across a gap that sustains the arc.

A "short circuit arc" can occur, for example, when an alternative (e.g., a change from the "normal" conduction path (e.g., from the return conductor at the inverter, through all the generating modules, to the feed conductor, and back to the inverter)) short circuit path to the opposite polarity or ground is established.

A short circuit can, for example and without limitation, form an alternative and un-wanted electrical path that a conventional protection function cannot detect or protect for currents taking an alternative path, such that excessive currents can cause overheating and arcs can cause fires.

An alternative short circuit path (e.g., such as the above un-wanted electrical path) can result in over currents due to back feed currents from adjacent strings to the short circuit path.

A short circuit path can be established at any point along series-connected electrical generating modules.

A short circuit path can also be established between the return or power line conductors from several strings routed in a common location or raceway, to a grounded frame, conduit, or conductor, or between the return or power line conductors from a combiner box to an inverter.

The disclosed concept is described in association with arc fault protection for photovoltaic (PV) circuits, although the disclosed concept is applicable to a wide range of DC applications, including, for example and without limitation, relatively higher DC voltage circuits, such as wind power, hybrid vehicles, electric vehicles, marine systems and aircraft.

The disclosed concept is described in association with strings including a plurality of photovoltaic electrical generating modules, although the disclosed concept is applicable to strings and string arrays including a plurality of direct current electrical generating modules (DC EGMs).

The disclosed concept detects arcing in a DC power system by monitoring various frequencies in the DC power feed. Typically, a base line of electrical noise exists in the DC power feed (e.g., DC line; DC return). Therefore, monitoring multiple (e.g., two or more; preferably three to ensure that an arc is present without nuisance tripping; any suitable plural count) frequencies is employed to ensure correct arc detection and trip declaration and to minimize nuisance trips.

Figure 2:
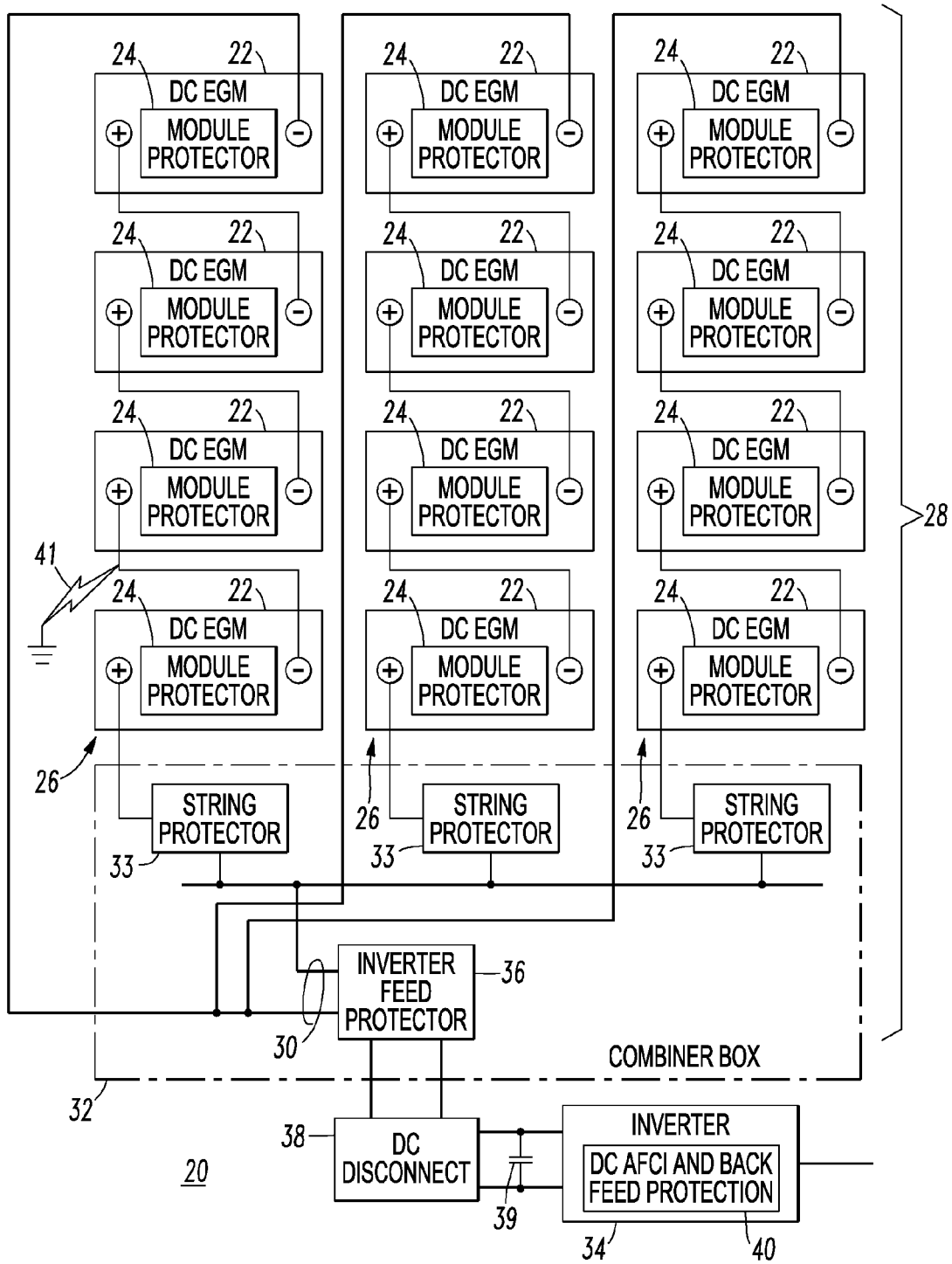
FIG. 2 is a block diagram of a photovoltaic (PV) power system including a plurality of DC arc fault circuit interrupters in accordance with embodiments of the disclosed concept.

Referring to FIG. 2, a photovoltaic (PV) power system 20 is shown including a plurality of direct current (DC) arc fault circuit interrupters (AFCIs), as will be described. The PV power system 20 includes a plurality of DC electrical generating modules (EGMs), such as the example PV modules 22, each of which includes a DC AFCI, such as the example module protector 24. Each of a plurality of strings 26 is formed by a plurality of the PV modules 22, which are electrically connected in series. An array 28 including a DC bus 30 is formed by the DC strings 26 as are electrically connected in parallel in the combiner box 32 including a string protector 33 for each of the DC strings 26. The DC bus 30 of the array 28 is electrically connected to an inverter 34 by an inverter feed protector 36 and a DC disconnect 38. One or both of the inverter feed protector 36 and the DC disconnect 38 can include a DC AFCI. The inverter 34 includes a DC AFCI 40, which provides back feed protection.

Figure 3:
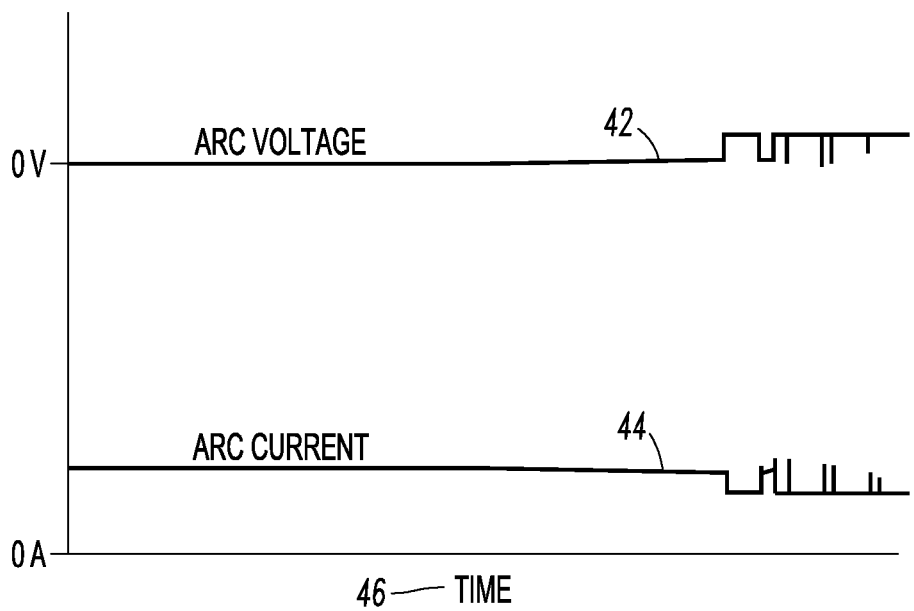
FIG. 3 is a plot of arc voltage and arc current for a DC arc fault.

FIG. 3 shows a plot of arc voltage 42 and arc current 44 versus time 46 for a DC arc fault, which occurs in time toward the left side (with respect to FIG. 3) of the plot.

Figure 4:
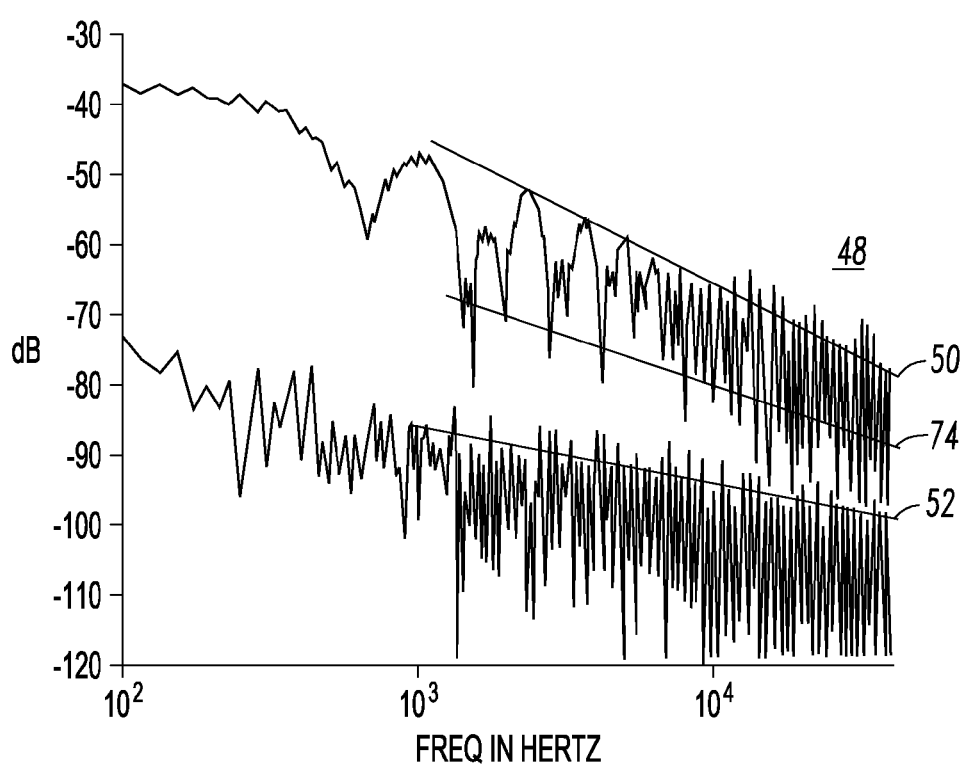
FIG. 4 is a frequency plot showing a fast Fourier transform (FFT) of both an arcing condition and a non-arcing condition showing a significant difference in signal strength of the frequencies for these two conditions.

FIG. 4 shows a frequency plot 48 of a fast Fourier transform (FFT) of both an arcing condition at arcing FFT 50 and a non-arcing condition at non-arcing FFT 52. The frequency plot 48 shows a significant difference (e.g., without limitation, about 30 dB or more) in signal strength of the frequencies for these two arcing and non-arcing conditions. No inverter was present during this test.

Figure 5:
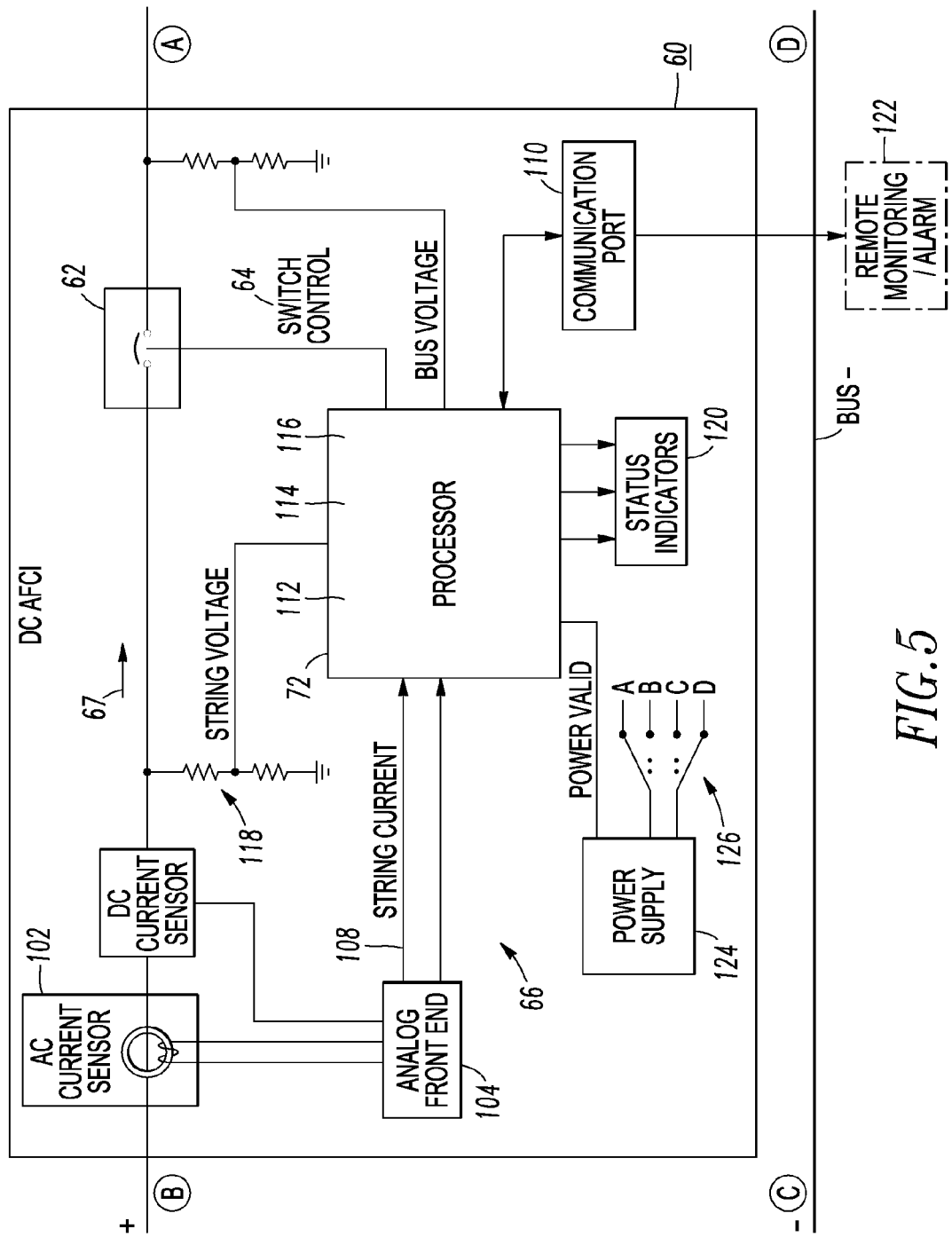
FIG. 5 is a block diagram in schematic form of a DC arc fault circuit interrupter in accordance with other embodiments of the disclosed concept.

Referring to FIG. 5, a direct current (DC) arc fault circuit interrupter (AFCI) 60 includes separable contacts 62, an operating mechanism 64 structured to open and close the separable contacts 62, and a trip circuit 66 cooperating with the operating mechanism 64 to trip open the separable contacts 62.

Figure 9:
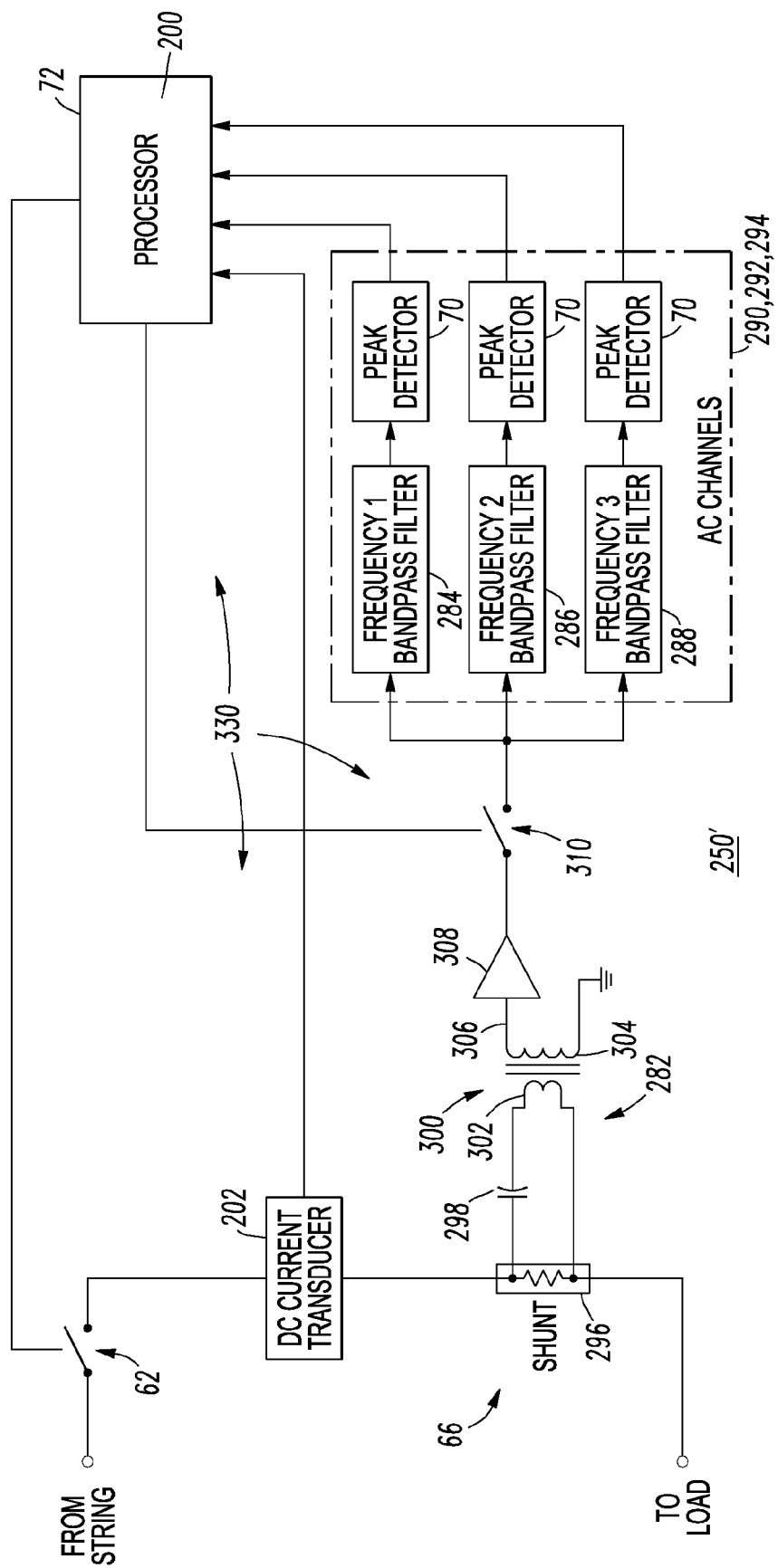
FIG. 9 is a block diagram in schematic form of a DC arc fault circuit interrupter including a shunt transformer current sensor with three active bandpass filters in accordance with another embodiment of the disclosed concept.
Figure 10:
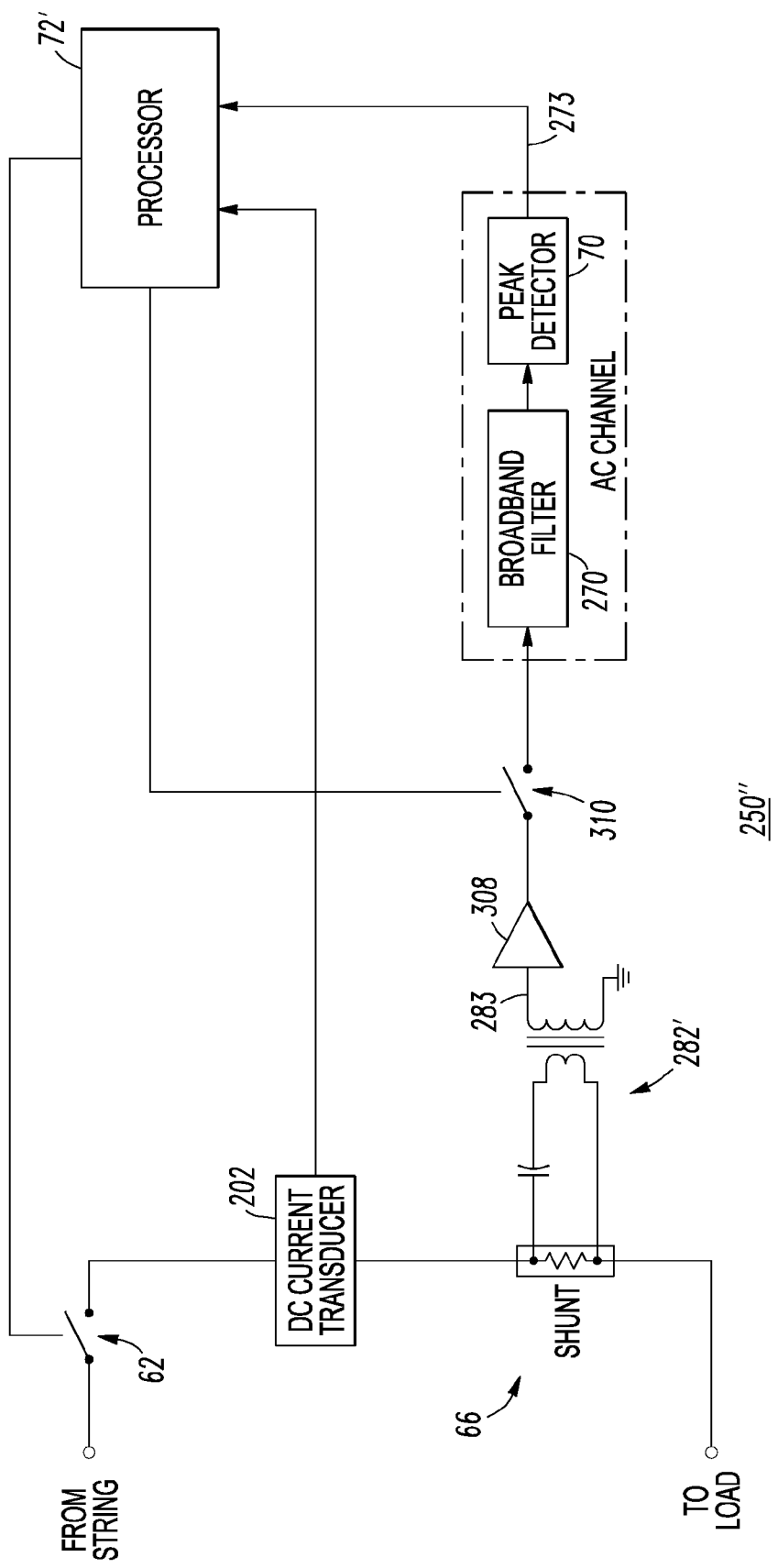
FIG. 10 is a block diagram in schematic form of a DC arc fault circuit interrupter including a broadband circuit in accordance with another embodiment of the disclosed concept.
Figure 11:
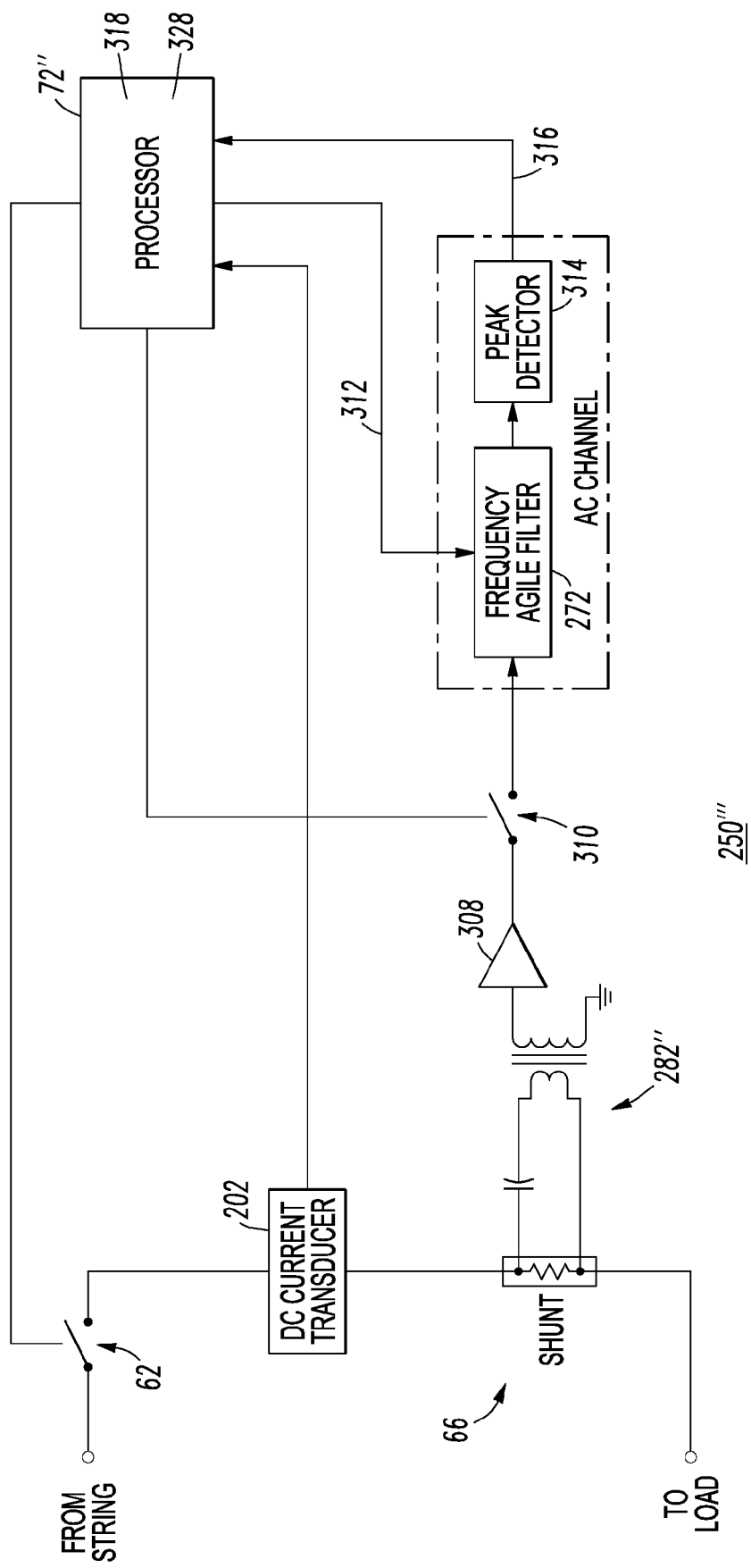
FIG. 11 is a block diagram in schematic form of a DC arc fault circuit interrupter including a frequency sweep circuit in accordance with another embodiment of the disclosed concept.

As will be discussed, below, in connection with FIGS. 7-11, the trip circuit 66 includes a number of alternating current sensors, such as 102, structured to sense a current 67 flowing through the separable contacts 62, a number of filter circuits 68 cooperating with the number of alternating current sensors 102 to output a number of alternating current signals, a number of peak detectors 70 cooperating with the number of filter circuits 68 to output a number of peak current signals 266, and a processor 72 cooperating with at least the number of peak detectors 70 and the operating mechanism 64. The processor 72 is structured to: (a) input the number of peak current signals 266 as a plurality of peak current signals or (b) input the number of peak current signals 266 and determine the plurality of peak current signals 318 (FIG. 11). The processor 72 is also structured to determine if the plurality of peak current signals exceed corresponding predetermined thresholds 74 (as shown, for example, with respect to line 74 of FIG. 4), and responsively cause the operating mechanism 64 to trip open the separable contacts 62.

The processor 72 can provide the corresponding predetermined thresholds 74 for arc detection. For example, as shown in FIG. 4, the thresholds 74 can be set above the typical total noise at the non-arcing FFT 52 and below the typical arc signal at the arcing FFT 50.

Figure 7:
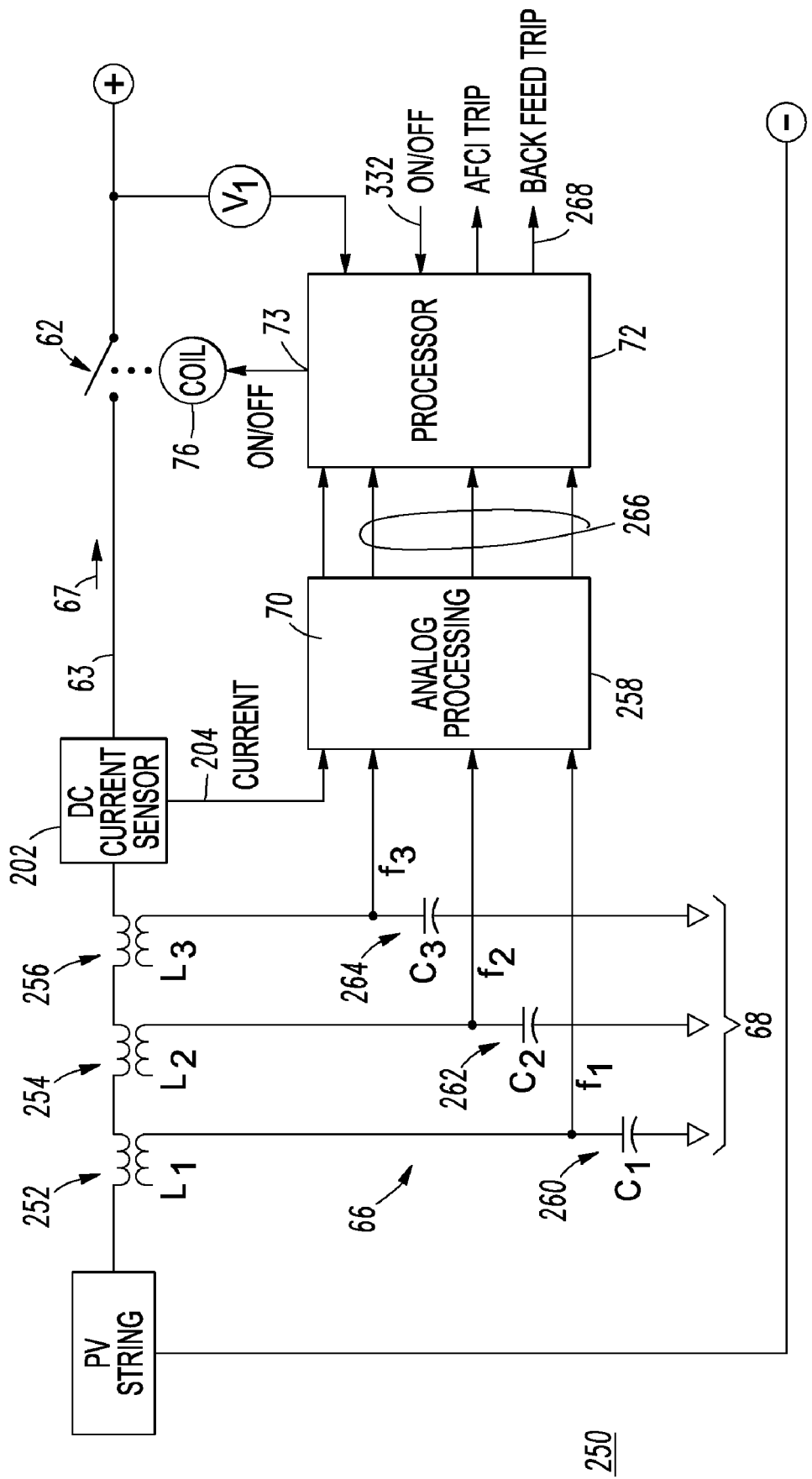
FIG. 7 is a block diagram in schematic form of a DC arc fault circuit interrupter including three current transformers (CTs) employing three predetermined relatively narrow frequency bands to avoid known noise sources in accordance with another embodiment of the disclosed concept.

As shown in FIG. 7, for example, the trip circuit 66 provides an arc fault detector including a number of alternating current sensors (e.g., without limitation, three example inductive coils $L_1, L_2, L_3$ are shown) structured to sense a current (e.g., typically, a direct current, which may have a number of alternating current components) flowing through a conductor 63 (e.g., in series with separable contacts 62), a number of filter circuits 68 cooperating with the number of alternating current sensors to output a number of alternating current signals, a number of peak detectors 70 cooperating with the number of filter circuits 68 to output a number of peak current signals 266 (e.g., without limitation, three are shown), an output 73 (e.g., without limitation, including a signal indicating an arc fault indication; a trip signal to an inverter (e.g., to shutoff), a direct current disconnect, a circuit interrupter, a switch, and the separable contacts 62 through coil 76), and the processor 72 cooperating with at least the number of peak detectors 70 and the output 73. The processor 72 is structured to (a) input the number of peak current signals 266 as a plurality of peak current signals or (b) input the number of peak current signals 266 and determine the plurality of peak current signals. The processor 72 is also structured to determine if the plurality of peak current signals 266 exceed the corresponding predetermined thresholds 74 for a predetermined time, and responsively activate the output 73.

EXAMPLE 1

Referring again to FIG. 5, the example DC AFCI 60 can be for a string (e.g., without limitation, DC string 26 of FIG. 2 having a string voltage of about 24 VDC to about 600 VDC at greater than about 7 A maximum) or a DC EGM, such as the PV module 22 of FIG. 2. The DC AFCI 60 includes the current sensor 102, an analog front end 104 and the processor 72 (e.g., without limitation, microprocessor) that monitors the sensed string current 108 and reports the same (e.g., without limitation, through communication port 110). The DC AFCI 60 can monitor current (I) and voltage (V). The processor 72 can include a number (e.g., one, some or all) of an over current protector routine 112, an arc fault protector routine 114 (e.g., series; parallel) and a reverse current protector routine 116, which can provide various protection/alarm functions, as well as string performance (e.g., open; low output). The example DC AFCI 60 also includes the separable contacts 62 controlled by the processor 72. The DC AFCI 60 can isolate, for example, the DC EGM 22 from the string 26 of FIG. 2 responsive to at least one of the over current protector, the arc fault protector and the reverse current protector routines 112,114,116. The DC AFCI 60 can be structured to measure current through the current sensor 102 and voltage generated by the DC EGM 22 through divider 118. Using the current sensor 102, the DC AFCI 60 can sense reverse flowing (back feed) currents under any short circuit condition. The ability to sense back feed currents permits such DC AFCI 60 to be commanded to terminate the flow of such back feed currents. Back feed currents are unwanted, since they can over heat a DC EGM and reduce the net current delivered to the inverter 34 (FIG. 2) or its load (not shown). Back feed currents can be greater than the forward feed currents if no fuse or other protection is present. Opening the separable contacts 62 mitigates against and/or prevents hazardous and/or unwanted currents if no fuse or other protection is present. Opening the separable contacts 62 mitigates against and/or prevents hazardous and/or unwanted currents (e.g., reducing energy delivered from the array 28 (FIG. 2) to the load) from flowing.

Preferably, the number of local status indicators 120 and/or the communication port 110 are also provided for remote monitoring and alarms. The DC AFCI 60 can be structured to report a fault state or health of a corresponding one of the strings 26 (FIG. 2) to a remote location, such as 122 (shown in phantom line drawing).

The DC AFCI 60 includes a power supply 124 that can receive power from an external power supply (not shown) (switch 126 at positions "A" and "D"), from a main bus (not shown) (switch 126 at positions "A" and "D") and/or from a corresponding local DC EGM 22 (switch 126 at positions "B" and "C").

EXAMPLE 2

Figure 6A:
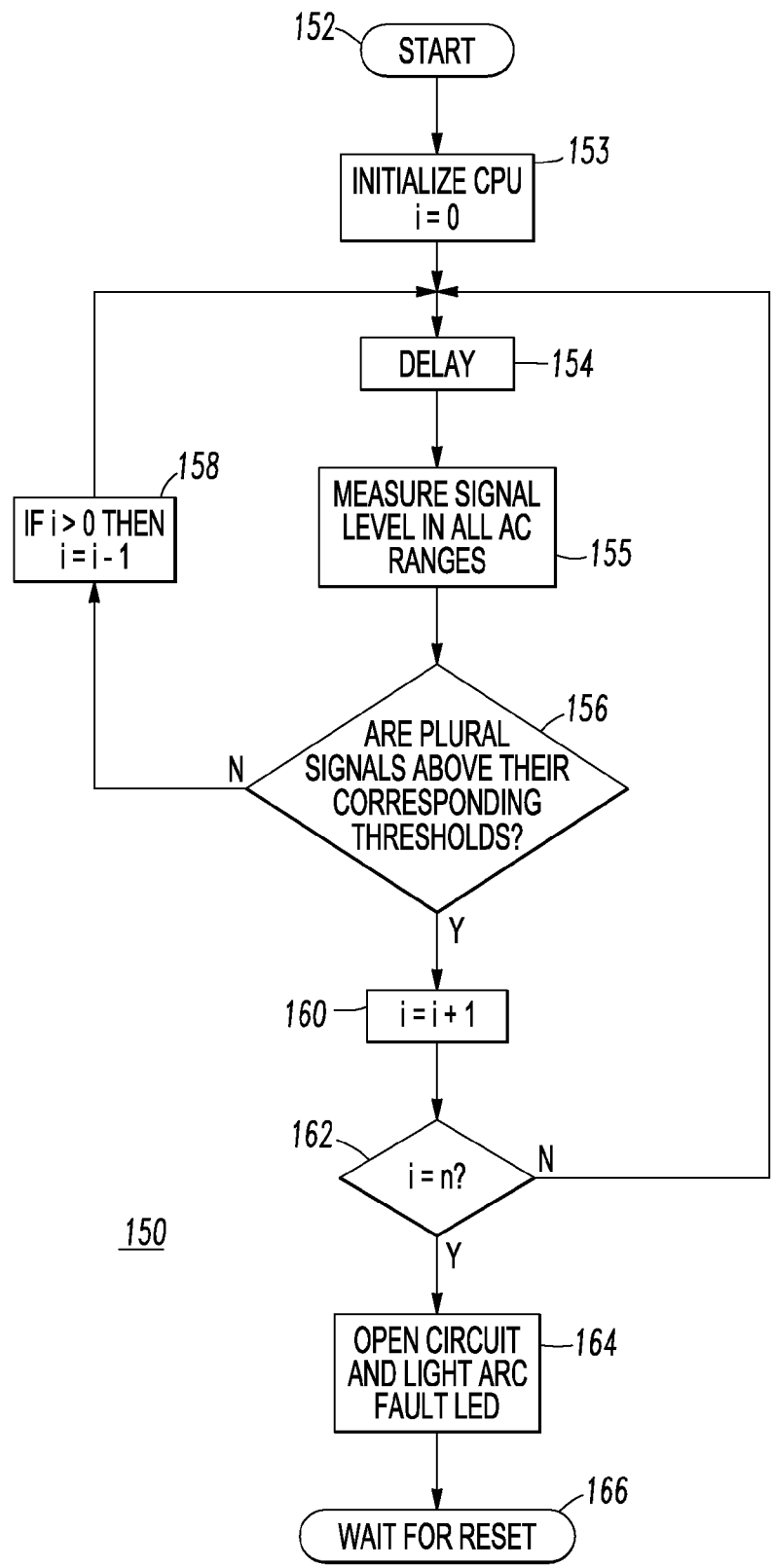
FIGS. 6A and 6B are flowcharts of routines providing DC arc fault detection, control and protection, and noise blanking, respectively, for the processor of FIG. 5.

FIG. 6A shows a routine 150 providing DC arc fault detection, control and protection for the processor 72 of FIG. 5. The routine 150 enables the processor 72 to detect a series arc fault or a parallel arc fault, such as a parallel arc to ground or to the return conductor. In FIG. 6A, the AC (frequency) thresholds of step 156 (thresholds 74 of FIG. 4) are valid for both series and parallel arcs.

The routine 150 starts at 152 after which the processor 72 is initialized at 153 and an integer, i, is set equal to zero. Next, at 154, a suitable delay (e.g., without limitation, 3 mS; any suitable delay time) is introduced. Then, at 155, the signal level is measured or input in all AC (high frequency) ranges of interest. Next, at 156, it is determined if a plurality (e.g., without limitation, three; any suitable plural count) of the peak current signals (e.g., 266 of FIG. 7) exceed the corresponding predetermined thresholds 74. If not, then at 158, the integer, i, is decremented if it is currently greater than zero, after which step 154 is repeated. Steps 160 and 162 determine whether the peak current signals exceed the corresponding predetermined thresholds 74 for a predetermined time. At 160, the integer, i, is incremented and, at 162, it is determined if the integer, i, is equal to a predetermined value (e.g., without limitation, n=10; any suitable plural count). If not, then step 154 is repeated. Otherwise, an arc fault is detected at 164, which causes the separable contacts 62 to open and causes an arc fault indicator (e.g., 120 of FIG. 5) to indicate the arc fault condition. Finally, step 166 waits for a reset command, which resets the DC AFCI 60 to its initial state.

For example, in FIG. 7 the processor 72 is structured to determine if all three example peak current signals 266 exceed three corresponding predetermined thresholds 74 for a predetermined time, and responsively cause the operating mechanism 64 to trip open the separable contacts 62. For example, this minimizes nuisance trips when responsively tripping a DC string, such as 26 (FIG. 2).

Figure 6B:
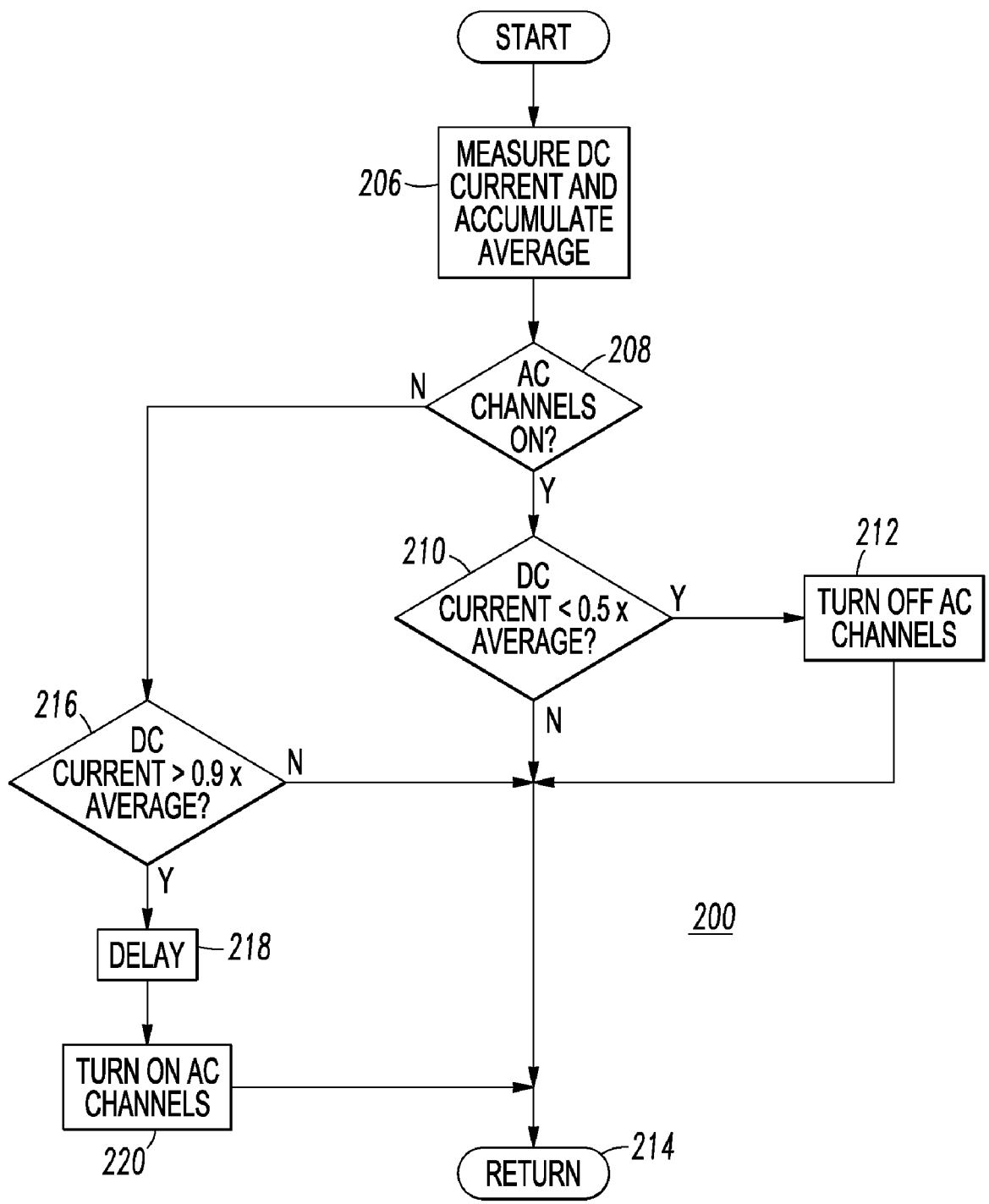

An optional noise blanking routine 200 of FIG. 6B is a separate routine that runs parallel to the arc fault detection routine 150 of FIG. 6A. The noise blanking routine 200 reduces nuisance trips by blocking noise from entering the number of filter circuits 68 and the number of peak detectors 70 when a transient condition occurs including a significant change in DC current level.

As is shown, for example, in FIGS. 7-11, the trip circuit 66 can further include a direct current sensor 202 in series with the separable contacts 62. The processor 72 is further structured to cooperate with the direct current sensor 202, input a sensed direct current signal 204 from the direct current sensor 202, and disable the number of filter circuits 68 if a rate of change of the sensed direct current signal 204 is greater than a first predetermined threshold or enable the number of filter circuits 68 if the rate of change is less than a different second predetermined threshold, which is less than the first predetermined threshold.

In the noise blanking routine 200 of FIG. 6B, step 206 inputs the sensed direct current signal 204 and accumulates an average thereof. Next, at 208, it is determined if the number of AC channels formed by the number of filter circuits 68 are on. If so, then at 210, it is determined if the present sensed direct current signal 204 is less than, for example and without limitation, half of the average of step 206. If so, then the number of AC channels are turned off at 212. Otherwise, or after 212, the routine 200 returns at 214 and is run again at 206 after a suitable delay.

On the other hand, if the number of AC channels are not on, as determined at 208, then at 216, it is determined if the present sensed direct current signal 204 is, for example and without limitation, greater than 0.9 times the average of step 206. If not, then the routine 200 returns at 214. Otherwise, at 218, a suitable delay (e.g., without limitation, 50 µS; any suitable time) is provided, after which the number of AC channels are turned on at 220 before the routine 200 returns at 214. This delay of step 218 is for the case when the AC channels are turned off and should not detect a transient condition. This provides noise blanking for at least the period of the delay.

The example noise blanking routine 200 is provided for transients other than series arcs or parallel arcs or other than current changes due to changes in illumination. The noise blanking routine 200 can detect, for example, relatively very large DC steps. A relatively large (and fast or high di/dt) step will create high frequencies and saturate all of the high frequency AC channels. For example, if an inverter turns off input currents for a few microseconds, then the DC AFCI 60 (FIG. 5) would see all the frequencies during this transient. Hence, it is advantageous to turn off the high frequency AC channels when detecting a relatively fast transition that went all the way (or close to) zero amperes, and then turn the high frequency AC channels back on when there are normal currents.

The example noise blanking routine 200 can be interrupt driven at a suitable rate (e.g., without limitation, 120 times per second; any suitable rate if a transient occurs at that rate).

EXAMPLE 3

Referring to FIG. 7, a DC arc fault circuit interrupter (AFCI) 250 is shown including three current transformers (CTs) 252,254,256 employing three example predetermined, relatively narrow frequency bands ($f_1$, $f_2$, $f_3$) to avoid known noise sources (e.g., without limitation, from a specific inverter (e.g., 34 of FIG. 2) with known switching frequencies). For example, the inductance (of the inductive coils $L_1$, $L_2$, $L_3$) and the capacitance (of the capacitors $C_1$, $C_2$, $C_3$) can be provided for suitable center frequencies of interest (e.g., without limitation, 1 kHz, 4 kHz, 10 kHz).

In this example, the number of filter circuits 68 is a plurality of filter circuits, the number of alternating current signals is a plurality of alternating current signals (e.g., one for each of the narrow frequency bands ($f_1$, $f_2$, $f_3$)), the number of peak detectors 70 of the analog processing circuit 258 is a plurality of peak detectors, and the number of peak current signals 266 provided to the processor 72 is a plurality of peak current signals.

EXAMPLE 4

As shown in FIG. 7, a plurality (e.g., two or more; preferably three to ensure that an arc is present without nuisance tripping; any suitable plural count) of sets of inductive coils ($L_1$, $L_2$, $L_3$) and capacitors ($C_1$, $C_2$, $C_3$) are selected to resonate at predetermined frequencies selected to avoid load and source interference (see, for example, Example 16, below). The outputs of the example filters 260,262,264 are input by the analog processing circuit 258. The processor 72 applies the plurality of peak current signals 266 to accumulators (not shown) and then to a suitable logic function (see, for example, FIG. 6A). If a plurality of the threshold detectors at steps 156,160,162 of FIG. 6A report activity above the corresponding predetermined thresholds 74 (see, for example, Example 15, below; as set between the typical maximum system noise and the typical minimum arc noise), which persists for a predetermined time (see, for example, Example 9, below), then the processor 72 causes a trip.

In this example, a plurality of alternating current sensors are provided by the inductive coils ($L_1$, $L_2$, $L_3$), which can be a plurality of current transformers, one for each of the different frequencies ($f_1$, $f_2$, $f_3$), and the number of filter circuits is a plurality of the filters 260,262,264, one for each of the different frequencies.

In connection with the example DC strings 26 of FIG. 2, a method of detecting arc faults of a corresponding one of the DC strings 26 by one of the string protectors 33 includes sensing an alternating current flowing through the DC string 26, filtering the sensed alternating current with a number of filter circuits 68 and outputting a number of alternating current signals, determining the plurality of peak current signals 266 from the number of alternating current signals, and determining if the plurality of peak current signals 266 exceed corresponding predetermined thresholds 74 (FIG. 4) for a predetermined time, and responsively tripping the DC string 26.

In connection with the example array 28 and the example inverter feed protector 36 of FIG. 2, a method detects arc faults of the array 28 by sensing an alternating current flowing through the array 28, filtering the sensed alternating current with a number of filter circuits 68 and outputting a number of alternating current signals, determining a plurality of peak current signals 266 from the number of alternating current signals, and determining if the plurality of peak current signals 266 exceed corresponding predetermined thresholds 74 (FIG. 4) for a predetermined time, and responsively tripping the array 28.

If the sensed DC current 204 of FIG. 7 goes negative, then the back feed trip 268 is initiated.

EXAMPLE 5

In FIG. 7, the DC current sensor 202 can be, for example and without limitation, a shunt or a Hall sensor.

EXAMPLE 6

In FIG. 7, suitable AC current sensors can include, for example and without limitation, a CT (e.g., one of the CTs 252,254,256), a shunt without isolation, a shunt with transformer (e.g., isolated, providing a suitably wide frequency response), or a Hall sensor (e.g., for less than about 50 kHz).

Figure 8:
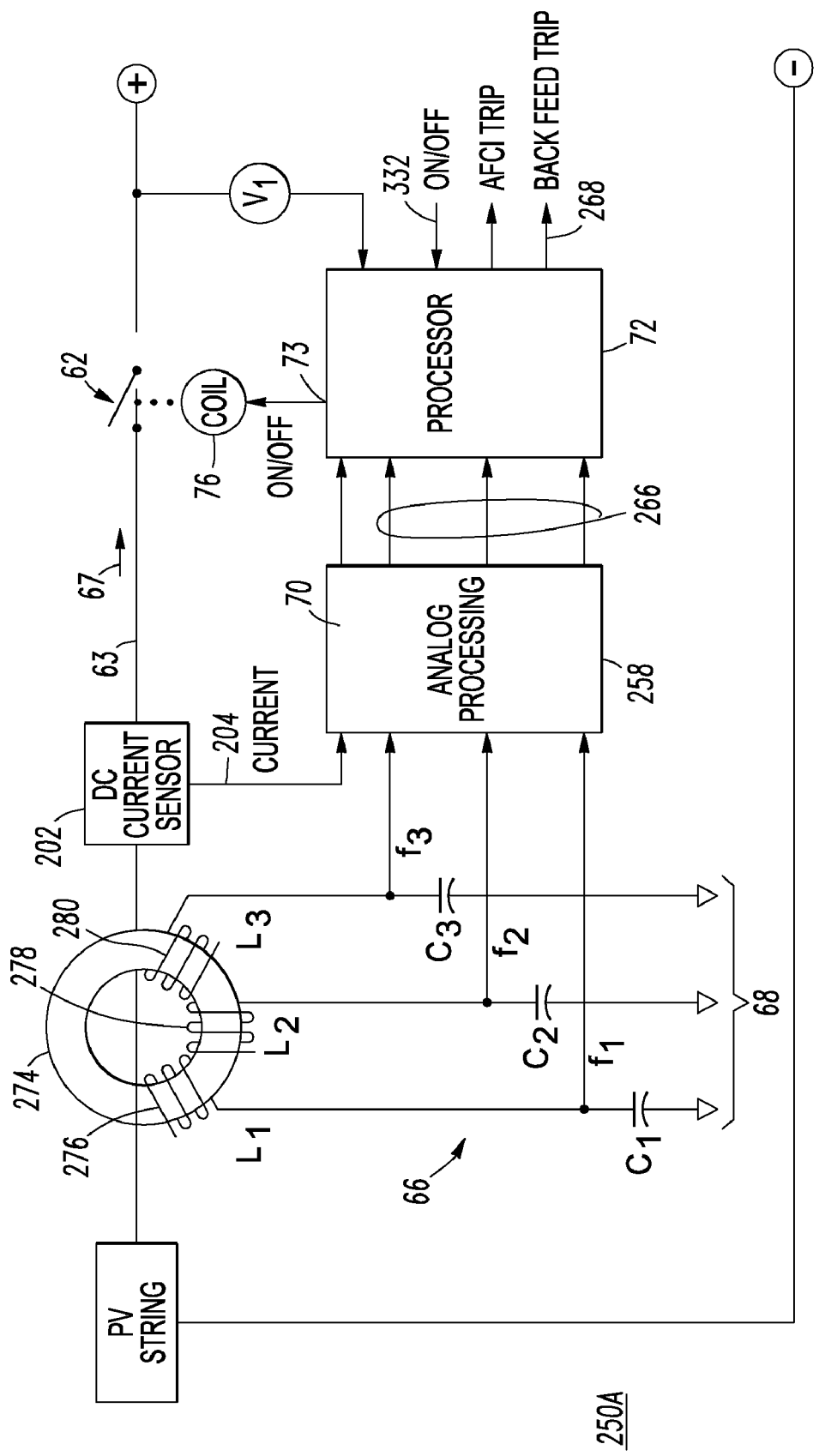
FIG. 8 is a block diagram in schematic form of a DC arc fault circuit interrupter including a single CT with three windings in accordance with another embodiment of the disclosed concept.

Suitable filters 260,262,264 for the three example AC current sensor frequencies ($f_1$, $f_2$, $f_3$), can include, for example and without limitation, filters discussed in Examples 7, 8, 17 and 18, below. These can include CT resonators (Examples 7 and 8; FIGS. 8 and 9), an active filter per frequency including one of the peak detectors 70 and a resonant circuit including a CT and a capacitor (one of the capacitors $C_1$, $C_2$, $C_3$ as shown in FIG. 7), a broadband filter 270 with processor integrator (Example 17; FIG. 10), and an adaptive (switched capacitor) filter 272 including sweep selected frequencies (Example 18; FIG. 11) or hop selected frequencies (Example 21; FIG. 11).

EXAMPLE 7

FIG. 8 shows a single CT 274 with three windings 276, 278,280 that provide CT resonators (e.g., one CT having plural windings, one winding for each of the different frequencies ($f_1$, $f_2$, $f_3$)). Otherwise, the DC arc fault circuit interrupter (AFCI) 250A is similar to the DC arc fault circuit interrupter (AFCI) 250 of FIG. 7.

EXAMPLE 8

FIG. 9 shows a shunt transformer current sensor 282 with three active bandpass filters 284,286,288 (e.g., one for each of the different frequencies (e.g., $f_1$, $f_2$, $f_3$)). This provides a CT resonator with three AC channels 290,292,294. The shunt transformer current sensor 282 includes a shunt 296 in series with the separable contacts 62, a capacitor 298 and a transformer 300 including a primary winding 302 and a secondary winding 304. The series combination of the capacitor 298 and the primary winding 302 is electrically connected in parallel with the shunt 296. The secondary winding 304 outputs a sensed alternating current signal 306 through a suitable amplifier 308 to a number (e.g., without limitation, three in this example; any suitable number) of filter circuits, such as the bandpass filters 284,286,288. Also, in this example, the trip circuit 66 further includes a blanking gate 310 controlled by the processor 72 and steps 212,220 of the noise blanking routine 200 of FIG. 6B.

Suitable filtering and frequency band selection for the different frequencies ($f_1$, $f_2$, $f_3$) is preferably employed with a predetermined frequency separation with rolloff (e.g., employing non-overlapping frequencies; $f_3$ is preferably at least about ten times $f_1$) therebetween. The different frequencies are selected to avoid, for example, inverter noise.

The DC current transducer 202 can be, for example, a Hall Effect device, such as, for example and without limitation, an Allegro® ACS714. The DC current transducer 202 provides galvanic isolation from the relatively high voltage of the DC EGM 22 and the corresponding DC string 26 (FIG. 2). The shunt 296, the capacitor 298 and the transformer 300 provide an AC current sensor. The capacitor 298 isolates the primary winding 302 of the transformer 300 from direct current to avoid core saturation. The transformer 300 employs a relatively large step-up ratio to provide "free" voltage gain and serves as a galvanic barrier for a relatively high string voltage. The post-transformer amplifier 308, along with the gain from the corresponding filter 284,286,288 and the corresponding peak detector 70, amplify the AC signal to a suitable level for the processor 72. The three example bandpass filters 284,286, 288 are tuned to suitable frequencies chosen to avoid false tripping from inverter noise. The three example peak detectors 70 extract the peak value of the filtered AC signal to present to the A/D converter (not shown) of the processor 72. The processor 72 analyzes the three example AC channels 290,292,294 to detect if an arc is present in the example PV power system 20 (FIG. 2). If so, it commands the separable contacts 62 to open.

If the noise blanker routine 200 of FIG. 6B is employed, then the processor 72 also controls the blanking gate 310, which blocks non-arc related inverter noise and step or inrush transients from causing false tripping.

Otherwise, the DC arc fault circuit interrupter (AFCI) 250' is similar to the DC arc fault circuit interrupter (AFCI) 250 of FIG. 7.

EXAMPLE 9

The trip decision logic of the DC arc fault detection routine 150 of step 156 of FIG. 6A can be a logical AND for three example selected frequencies each frequency being above a predetermined threshold (see, for example, Example 15, below) for greater than a predetermined count of samples (e.g., without limitation, greater than 10 samples; greater than a percentage of samples; greater for all samples over a predetermined count; 30 mS; any suitable time or value), in order to indicate an arc is present, which causes a trip.

As shown in FIGS. 7-11, the trip circuit 66 can include the direct current sensor 202 structured to sense the current flowing through the separable contacts 62, and the processor 72 can be structured to detect a level shift in the sensed current from the direct current sensor 202. This is discussed in Examples 10-13, below.

EXAMPLE 10

Preferably, additional logic is employed to prevent nuisance trips. For example, the processor 72 can turn off AC signal input if the DC current level has a significant step change down (FIG. 6B) (e.g., noise blanking during inverter startup and other conditions, such as inverter PWM during saturation). The processer 72 can detect a level shift in DC current as an additional "qualifier" for detecting an arc. For example, when the array 28 (FIG. 2) is generating more power than the inverter 34 can receive and convert, the inverter 34 may PWM (i.e., turn off briefly and periodically) to limit the incoming current. This transient should not cause the DC AFCI (e.g., without limitation, module protector 24; string protector 33; inverter feed protector 36) to nuisance trip.

EXAMPLE 11

Preferably, additional logic is employed to detect a parallel arc on the bus/feed line: if the arc is present and the DC current steps up at the feed end. This is for an arc above the DC string 26 at the DC bus 30 since the current in the feed always drops (goes more negative) when the parallel arc, such as 41, is below the string protector 33 even without backfeed.

EXAMPLE 12

Preferably, additional logic is employed to detect a parallel arc: if the arc is present and the DC current steps up at the remote end. This always occurs because a fault is placed in parallel across the remote DC EGMs 22 (FIG. 2) (below the fault) that lowers the impedance and increases the current. Typically, baseline and arc noise are both lower since the inverter 34 is not "seen" by the remote end under a parallel arc (short), although arc noise is detected.

EXAMPLE 13

Preferably, additional logic is employed to detect when the inverter 34 shuts off: bus voltage goes up and the DC current goes down. If all DC strings 26, in parallel, are equally illuminated, then the current approaches zero since all DC strings 26 produce the same open circuit voltage. If there is a difference in voltage between the DC strings 26 due to, for example, illumination, then the higher producing DC strings 26 will backfeed the lower producing DC strings 26, still causing all currents to decrease compared to when the inverter 34 was present. The maximum backfeed current in a 7 A string is about 1 A when all diodes (not shown) are present (no fault). One exception to the current being reduced is when all DC strings 26 are shadowed except one, which could permit that string's current to rise when the inverter 34 is disconnected because its maximum power point just before inverter disconnection could be at a relatively very low voltage with respect to rated voltage.

EXAMPLE 14

Preferably, additional logic is employed to discriminate between random (e.g., arcing) and periodic (e.g., inverter) signals to further reduce nuisance trips. See, for example, Example 18, below. For example, if a bandpass filter peak detector 70 (FIG. 9) is active, then the processor 72 looks to see if it contains a signal that varies over time within the trip time window. This would most conveniently occur at the "baseband" rectified-signal level, with the variation measured at a rate less than the bandwidth of the corresponding baseband filter 284,286,288 (i.e., in other words, a relatively slower average). It could also be achieved by looking at a minimum and maximum over the period of samples, or by considering a statistical parameter akin to a standard deviation within hardware or software logic.

EXAMPLE 15

Table 1 provides example measured relative signal strengths for arcing and non-arcing conditions (see FIG. 4).

TABLE 1

| Frequency | Arcing Condition | Non-Arcing Condition |
|---|---|---|
| 1 kHz | −50 dB | −85 dB |
| 4 kHz | −60 dB | −90 dB |
| 10 kHz | −70 dB | −95 dB |
| 40 kHz | −75 dB | −100 dB |

The values of Table 1 were produced using an FFT with 65K points sampled at 1 MHz. To relate the dB values to amperes, the number of points in the FFT contained within the bandwidth of a filter must be determined as "n" (in this case, the frequency resolution is about 15 Hz, so n=FilterBandwidth (Hz)/15). Then, amperes=$\sqrt{n}$*Average_dB over filter bandwidth.

EXAMPLE 16

Typical switching frequencies for inverters, such as 34 (FIG. 2), include, for example, 20 kHz for relatively small inverters or 8 kHz for relatively large inverters. DC to DC converters typically switch at about 30 kHz to about 40 kHz.

Typically, the inverter noise is narrow band with one or more significant odd harmonics. Thus, selection of the filter detection frequencies (e.g., without limitation, $f_1$, $f_2$, $f_3$) requires that they span a factor of at least about 10, and preferably about 30 (or about 1.5 orders of magnitude) in order that at least one frequency in the, for example and without limitation, AND decision of FIG. 6A is unaffected.

EXAMPLE 17

Referring to FIG. 10, a broadband filter 270 with processor integrator or rectifier with filtering is shown. Otherwise, the DC arc fault circuit interrupter (AFCI) 250" is similar to the DC arc fault circuit interrupter (AFCI) 250' of FIG. 9. Somewhat similar to the routine 150 of FIG. 6A, the processor 72' integrates or averages the output of the broadband filter 270 and peak detector 70 over time, feeds the average signal into one threshold detector (e.g., similar to step 156 of FIG. 6A, albeit for one signal), and performs a suitable logic function. A broadband sensor output of shunt transformer current sensor 282' includes the frequencies from the broadband sensor (e.g., F low to F high) (these two frequencies are preferably respectively below and above the range of $f_1$, $f_2$ and $f_3$ of FIG. 7, but could be any suitable broadband range of frequencies that preferably avoids or overpowers inverter fundamentals). The processor 72' integrates a value for the frequencies between F low and F high. If the integrated value exceeds a predetermined threshold, and if a DC current decrease is optionally detected, then the processor 72' causes a trip.

This example provides integration over a suitable frequency band (e.g., between F low and F high) in order that no single peak frequency causes a trip. This provides a relatively low cost solution, but might have nuisance tripping in connection with certain inverters.

In FIG. 10, the single broadband filter 270 has a relative low Q (e.g., typically, Q<=1 or <<1). For some inverters, such as 34 (FIG. 2), switching noise is not adequate (since the peaks are typically relatively narrow) to raise the total activity in broadband like an arcing fault.

In FIG. 10, the number of filter circuits 68 (FIG. 7) is one broadband filter circuit 270. The number of peak detectors 70 is one peak detector 70 cooperating with the broadband filter circuit 270 to output a peak current signal 273 to the processor 72'. The peak current signal 273 is representative of the plurality of different frequencies of the frequency band (e.g., between F low and F high).

EXAMPLE 18

Referring to FIG. 11, an adaptive (switched capacitor) filter 272 is employed by a DC arc fault circuit interrupter (AFCI) 250''', which is similar to the DC arc fault circuit interrupter (AFCI) 250" of FIG. 10. The processor 72" employs a routine similar to the routine of FIG. 6A, although an additional step (not shown) is added at the step 153 (in order to commission with a new inverter) to identify the frequencies to ignore, and the "valley" frequencies to use). The adaptive (switched capacitor) filter 272 provides a frequency sweep circuit, which is controlled by a clock signal 312 from the processor 72".

In FIG. 11, the number of filter circuits 68 (FIG. 7) is one frequency agile filter circuit 272. The number of peak detectors 70 is a peak detector 314 cooperating with the one frequency agile filter circuit 272 to output a peak current signal 316 to the processor 72". The processor 72" is structured to control the one frequency agile filter circuit 272 to determine a plurality of peak current signals 318, one for each of a plurality of different frequencies.

This sweep frequency circuit of FIG. 11 employs a sweeping detector to identify relatively strong signals in a relatively narrow frequency band (or sweep window) and ignore them (by looking for "spikes" above a nominal noise floor) as noise. The sweep frequency sweeping detector measures activity in the sweep window. The sweep frequency circuit outputs the signal 316 to the processor 72" including the frequencies from the sweep frequency sensor 282" (F low to F high). The processor 72" looks for narrow band noise at relatively high strength frequencies representing common radio frequency (RF) noise from, for example, power supplies or inverters, such as 34 (FIG. 2), and ignores those frequency bands. If a frequency band was high during "normal" operation due to load (inverter) characteristic noise, then the processor 72" does not consider that band when looking for an arc by seeing high levels in multiple different bands. The processor 72" then calculates a threshold value for the remaining frequency bands. For the remaining frequency bands, if the average value is above a predetermined threshold value, excluding load characteristic noise, then the circuit causes a trip.

This example finds (and avoids) inverter noise frequencies by selecting "valley" frequencies for detecting arcs. This provides robust arc fault detection in order to accommodate new inverters with different switching frequencies.

In FIG. 11, the circuit first finds the inverter noise frequencies (e.g., count of N>=2), and then avoids them by selecting (1–N) "valley" frequencies for detecting the arc. This approach works well regardless of the inverter type.

If the noise blanker routine 200 of FIG. 6B is employed, then the processor 72" also controls the blanking gate 310, which blocks non-arc related inverter noise from causing false tripping.

EXAMPLE 19

Alternatively, the randomness of the broadband signal 283 output by the shunt transformer current sensor 282' of FIG. 10 can be considered. If no arc is present, then the broadband signal 283 is relatively constant due to inverter switching. However, with an arc, the broadband signal 283 is a random high frequency signal. A suitable circuit or routine of the processor 72' can detect the randomness of the broadband signal 283 and command the separable contacts 62 to open.

EXAMPLE 20

Figure 12:
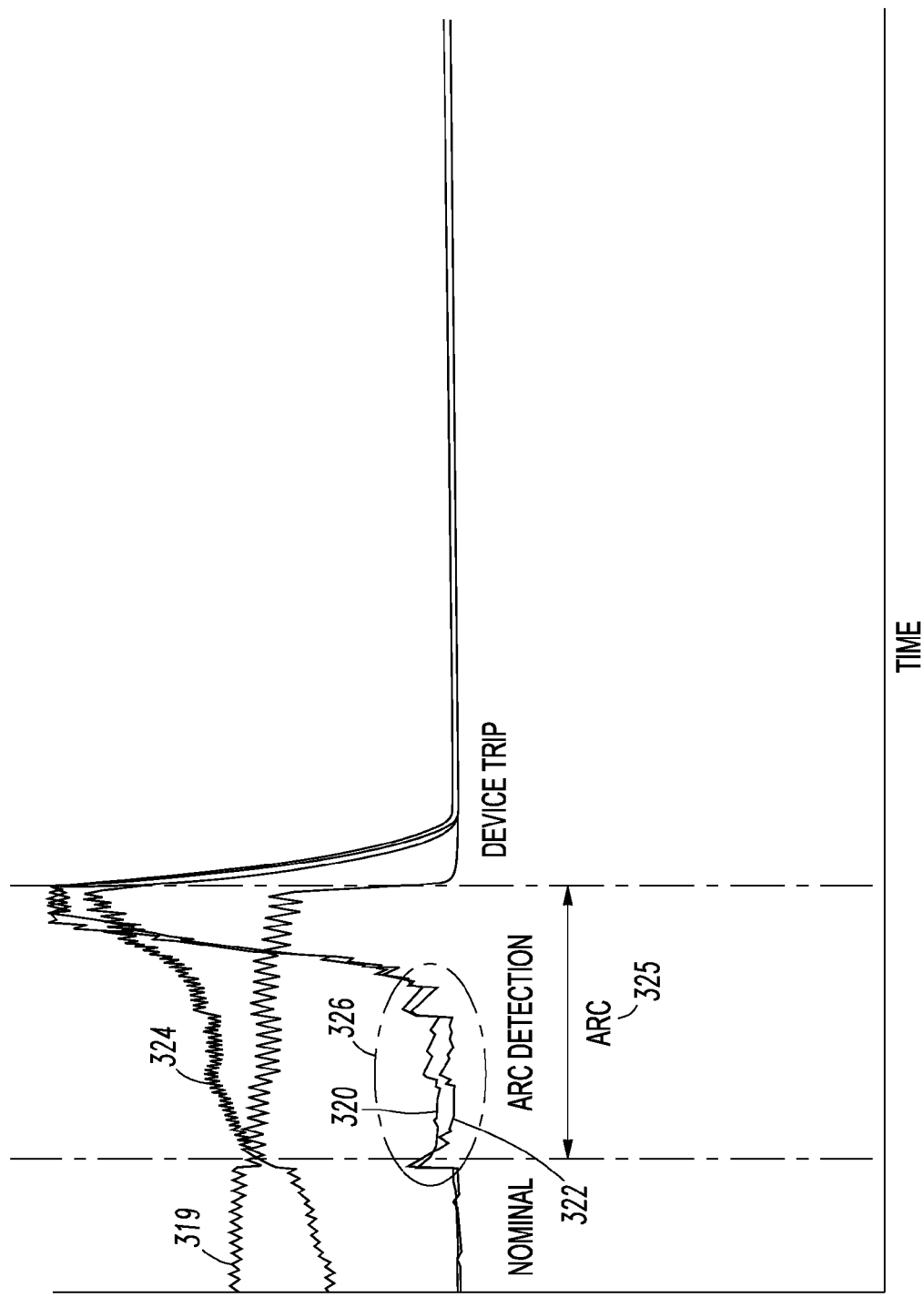
FIG. 12 is a plot of a direct current signal, three alternating current signals at different frequencies, and a trip signal before, during and after an arc.

FIG. 12 shows a plot of the current signal 319 and three example signals: 2.5 kHz 320, 8 kHz 322 and 90 kHz 324, before, during and after an arc 325. Prior to the arc, the 2.5 kHz and 8 kHz signals 320,322 are relatively low and "quiet" (i.e., there is relatively little change). During arcing, these signals 320,322 have elevated levels and, also, there are relatively many changes in magnitude (e.g., many steps (e.g., relatively high levels of di/dt) can be seen). A constant high frequency signal, like the one from an inverter's switching frequency, might result in an elevated level of high frequency as is shown by the example 90 kHz signal 324. However, it will stay relatively very constant. In contrast, an arcing signal will put out a broadband of frequencies, but the arcing signal will also change in magnitude rapidly over time. This can be used to detect arcing. As the processor 72 (FIG. 9) samples the frequency bands, it can check for rapid magnitude changes over time and determine an arcing event. For example, the region 326 with a relatively high level of randomness (di/dt changes) is shown during the arc 325 with the example 2.5 kHz and 8 kHz signals 320,322.

EXAMPLE 21

Referring again to FIG. 11, the processor 72" can employ a frequency hopping routine 328. Instead of three example frequencies (e.g., FIG. 9), there are N frequencies, and the processor 72" can look for some or all of them to increase above the corresponding threshold 74 (FIG. 4) when an arc is present. Note that when no arc is present, some frequencies may still be above the corresponding threshold due to inverter noise. The frequency hopping routine 328 can employ a predetermined set of frequencies (e.g., without limitation, 1 kHz, 2 kHz, 5 kHz, 10 kHz, 20 kHz, 50 kHz, 100 kHz) that are preferably mutually exclusive of all known noise models (see, for example, Example 16, above) for a particular application and include frequencies that are not multiples of each other to avoid harmonics of the fundamentals of switching frequencies. This frequency hopping routine 328 hops to each of the predetermined frequencies to measure the strength of the signal. If the signal is above a predetermined threshold level for some or all of the frequency bands (see, for example, Example 15, above) indicating a DC arc, then the routine 328 causes a trip.

This example sequences through selected frequencies to assess noise levels and detect arcing (e.g., inverter switching is present at some frequencies during normal operation, with higher levels being on all frequencies during arcing). Preferably, to confirm and validate a correct declaration of arcing, several hop frequencies are detected before declaring an arcing condition.

The frequency hopping routine 328 sequences through a sequence of frequencies to assess noise levels. Under normal operation, inverter noise will be relatively high in some bands, but still higher in all bands during arcing.

For example, if N is 10 different frequencies, then, for example, I=3 of those frequencies might correspond to inverter noise. Hence, only M=N−I=7 frequencies are considered. By using the frequency hopping routine 328, it is possible to consider relatively more frequencies than would be practically available using, say, an individual bandpass circuit per frequency as in FIG. 9. In turn, if each of a majority of those frequencies (e.g., without limitation, 4, 5, 6 or 7 frequencies, in this example) have a signal above a corresponding threshold, then an arcing condition is declared.

Here, for example, the processor 72" can be further structured to eliminate a number of the plurality of different frequencies and to eliminate the same number of the plurality of peak current signals based upon a number of external noise sources.

Another non-limiting technique of sampling relatively many frequencies is to use a frequency sweep method from, for example, 1 to 100 kHz over 0.25 S in which virtually all of the sampled frequencies are above a predetermined threshold, which would not be true in the presence of a single switching frequency and its harmonics. This approach and the frequency hopping concept might even be able to accommodate more than one inverter type working in parallel.

EXAMPLE 22

The disclosed DC AFCIs 250,250',250",250''' can be employed to provide stand-alone detection, control and protection, for example and without limitation, as a module protector for one or more of a direct current electrical generating module, a string protector, an array protector, a protector for a combiner box, a protector of a sub-combiner box, a protector for a remote combiner box, a protector for an inverter or a central inverter or a string inverter, a protector for a converter, a protector for a module converter, a protector for a module junction box, and a protector for a disconnect or a circuit breaker.

As shown in FIG. 5, the example DC AFCI 60 can include separable contacts 62, the current sensor 102 for the detection of arcing and over current events, and the trip circuit 66 including analog and digital components suitable for processing signals for the detection of arcing and over currents, and for processing ON/OFF command signals 332 (FIG. 7) from remote locations (e.g., through communication port 110 of FIG. 5).

Arc fault detection can be accomplished using the suitable current sensor 102 on the positive DC connection (as shown) and/or the negative DC connection (not shown), that senses the current level entering and/or leaving the DC EGM 22 (FIG. 2). The personality of the current waveform is interrogated to determine if there is an arcing event or if there is a bolted fault. Arc fault and bolted fault events are determined by current waveform attributes from DC and AC sensors.

EXAMPLE 23

The example string protector 33 (FIG. 2) is structured to detect and provide at least one of string performance information (e.g., without limitation, DC current; whether equal to nominal, less than nominal, greater than nominal, or zero), string alarm information (e.g., without limitation, arc fault; zero current; reverse current; module shorted (Vsc=0)); and annunciation information (e.g., without limitation, reduced power output (e.g., current power output is compared to one of a predetermined value, a remotely determined and communicated value based upon current illumination level, or a learned value); open circuit; reverse/over current; short circuit). A learned value could be, for example, an average value logged at the same time of day (maybe at the same hour) over the previous 10 days, or another suitable statistical value. Another approach is to measure illumination, and compare with a suitable performance measure (like module power) with the MPP consistent optimum power at that illumination (and temperature).

Through the example status indicators 120 (FIG. 5), the DC AFCI 60 can indicate alarm information locally (e.g., at a DC EGM or string) with, for example, LEDs, and indicate string performance with, for example, an LED bar (e.g., 0%, 20%, 40%, 60%, 80%, 100%, 120% of nominal). Otherwise, if these are communicated to a remote location 122 through communication port 110, then they can be displayed on a suitable user interface (not shown).

EXAMPLE 24

As shown with reference to FIGS. 6B and 9-11, a DC AFCI noise blanking circuit 330 includes the direct current sensor 202 structured to be in series with the separable contacts 62, and a processor 72,72',72" cooperating with the direct current sensor 202. The processor routine 200 is structured to input a sensed direct current signal from the direct current sensor 202, and disable the number of alternating current channels 290,292,294 (FIG. 9) if a rate of change of the sensed direct current signal in the negative direction is greater than a first predetermined threshold or enable the number of alternating current channels 290,292,294 if the rate of change is less than a different second predetermined threshold, which is less than the first predetermined threshold.

For example and without limitation, if the routine 200 is executed every millisecond and the current sample drops below 0.5 times the average of the previous 10 samples, then the alternating channels 290,292,294 will be disabled at 212 for a predetermined time. When the sample value at one of the next samples reaches a value greater than 0.9 times the average value, these alternating channels 290,292,294 will be enabled again.

EXAMPLE 25

As shown by steps 206,208,210,212 of FIG. 6B, the routine 200 accumulates an average of the sensed direct current signal from the direct current sensor 202, determines if the number of alternating current channels 290,292,294 are enabled, and responsively disables the number of alternating current channels 290,292,294 if the averaged sensed direct current signal is less than a third predetermined threshold (e.g., without limitation, less than one-half of the average; any suitable fraction of the average).

EXAMPLE 26

As shown by steps 206,208,216,218,220 of FIG. 6B, the routine 200 accumulates an average of the sensed direct current signal from the direct current sensor 202, determines if the number of alternating current channels 290,292,294 are disabled, and responsively enables the number of alternating current channels 290,292,294 if the averaged sensed direct current signal is greater than a fourth predetermined threshold (e.g., without limitation, greater than 0.9 of the average; any suitable fraction of the average), which is greater than the third predetermined threshold.

EXAMPLE 27

As shown by steps 216,218,220 of FIG. 6B, the routine 200 delays for a predetermined time (e.g., without limitation, 50 μS; any suitable time) after determining that the averaged sensed direct current signal is greater than the fourth predetermined threshold and before responsively enabling the number of alternating current channels 290,292,294.

EXAMPLE 28

Referring to FIGS. 2 and 7, the inverter 34 is powered by the array 28. The inverter feed protector 36 senses the alternating high frequency current flowing through the array 28 with a number of current sensors (e.g., without limitation, inductive coils $L_1, L_2, L_3$ of FIG. 7). The plurality of different frequencies (e.g., without limitation, $f_1, f_2, f_3$ of FIG. 7) operatively associated with the number of filter circuits 68 and the number of peak current signals 266 are employed. A capacitor 39 (FIG. 2) is disposed between the number of current sensors of the inverter feed protector 36 and the inverter 34 to limit crosstalk between different ones of the direct current strings 26 at the different frequencies. The capacitor 39 acts as a short for AC noise on the conductors between the DC EGMs 22. The AC noise propagates from an arc 41 (e.g., in the string 26 on the left side with respect to FIG. 2) toward the inverter 34 and not toward the adjacent, parallel strings 26 (e.g., the strings 26 on the center and right sides with respect to FIG. 2). The capacitor 39 can be located inside of a protection device, it can be a separate external component, or it can be part of the input circuit of the inverter 34.

EXAMPLE 29

The input capacitance of the inverter 34 often provides an adequate capacitance to create a suitable low impedance path for the high frequency signal. It can be advantageous to add more capacitance to ensure that enough capacitance is present. A capacitance can be added at the location of the protection device upstream of the alternating current sensor to present an impedance on the bus which is relatively small compared to the impedance of a non-faulted string (e.g., to provide AC isolation between the strings or sub-arrays). For example and without limitation, a capacitance of about 50 µF provides a suitably low impedance path compared to the inverter input impedances for frequencies higher than about 2.5 kHz.

EXAMPLE 30

Referring to FIGS. 2 and 5, with the string protectors 33, a user can identify (e.g., by looking at the local status indicators 120 of the DC AFCI 60; by looking at the remote monitoring/alarm 122 if communicated by the communication port 110) which of the plurality of direct current strings 26 (FIG. 2) is faulted.

EXAMPLE 31

At some point, the series connections in the string of DC EGMs 22 might be so damaged that the entire string 26 of FIG. 2 needs to be turned off. The corresponding string protector 33 located in the combiner box 32 provides protection at that level.

At some point, the number of strings 26 in a fault mode may be so large that the array 28 needs to be turned off and separated from the PV power system 20 of FIG. 2. An array protector, such as the inverter feed protector 36, provides protection at that level.

The disclosed DC AFCI 60 can protect, for example and without limitation, the relatively higher current, high voltage conductors between the string array 28 and the inverter 34 of FIG. 2 and can be commanded to turn off under a plurality of fault scenarios that can develop in the power circuits of the string array 28.

The disclosed string protector 33 or DC AFCI 60 can also be located in or at any component (e.g., without limitation, circuit breaker; combiner box; sub-combiner box; remote combiner box; DC EGM; inverter; central inverter; string inverter; converter; module converter; module junction box; disconnect) of any PV system, string or array.

EXAMPLE 32

Although separable contacts 62 are disclosed, suitable solid state separable contacts may be employed. For example, the disclosed DC AFCI 60 includes a suitable circuit interrupter mechanism, such as the separable contacts 62 that are opened and closed by the operating mechanism 64, although the disclosed concept is applicable to a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms).

EXAMPLE 33

Figure 13:
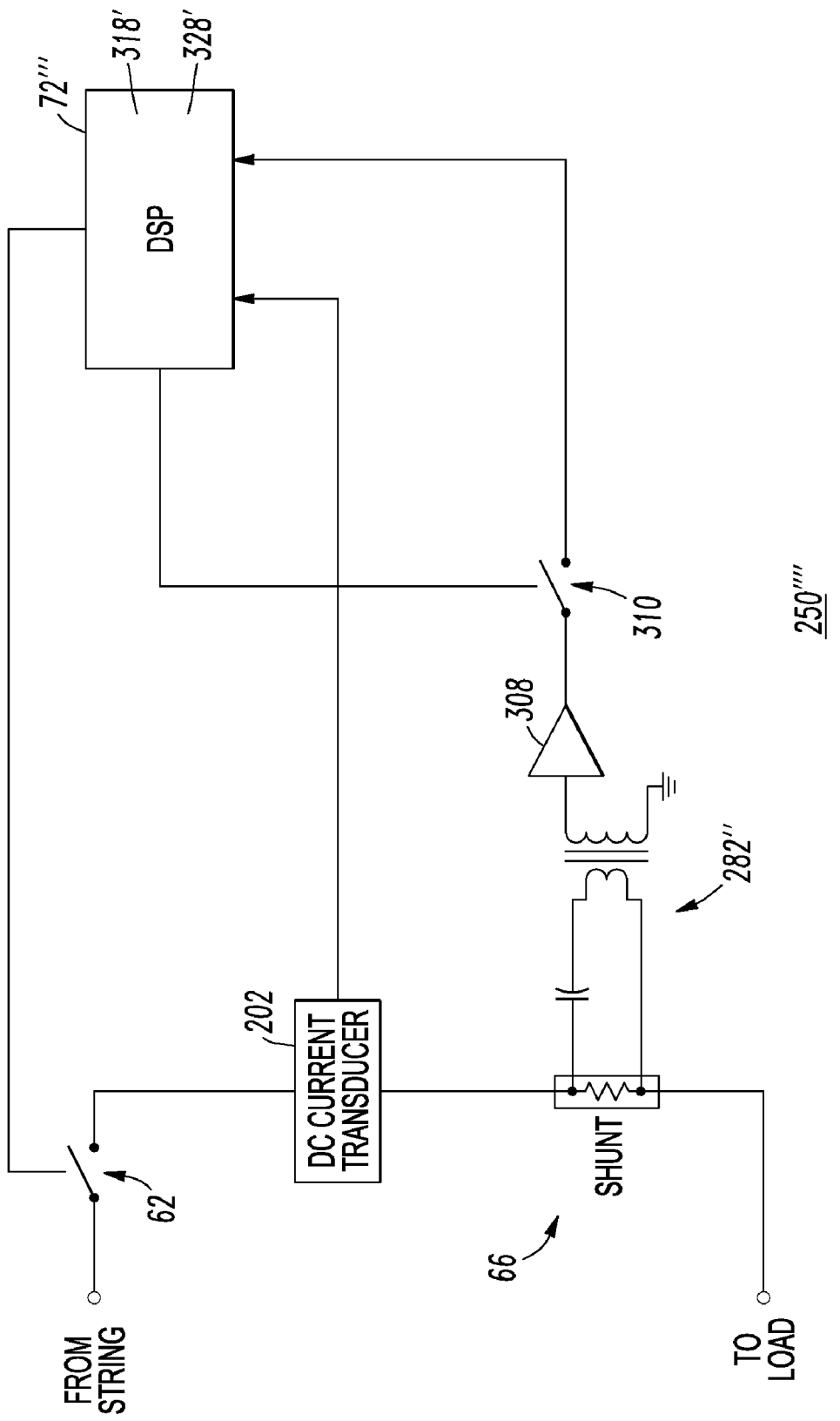
FIG. 13 is a block diagram in schematic form of a DC arc fault circuit interrupter including a digital signal processor in accordance with another embodiment of the disclosed concept.

Referring to FIG. 13, a digital signal processor (DSP) 72''' is employed by a DC arc fault circuit interrupter (AFCI) 250'''', which is similar to the DC arc fault circuit interrupter (AFCI) 250''' of FIG. 11, except that the processor is different and the hardware filter 272 and peak detector 314 are implemented by the DSP 72'''. The output from the amplifier 308 goes straight into the A/D converter (not shown) of the DSP 72''' through the optional blanking gate 310. The DSP 72''' samples fast enough to do a FFT (e.g., without limitation, sampling at 200 kHz to cover frequencies up to about 100 kHz). The firmware 328' in the DSP 72''' can determine, for example, a plurality of peaks in the spectrum of an analog current signal 318' from the amplifier 308, noise level, switching frequencies, changes due to arcing, and it can, for example, be adaptive.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A direct current arc fault circuit interrupter comprising:
    separable contacts;
    an operating mechanism structured to open and close said separable contacts;
    a trip circuit cooperating with said operating mechanism to trip open said separable contacts, said trip circuit comprising:
        a number of alternating current sensors structured to sense a current flowing through said separable contacts,
        a direct current sensor structured to sense the current flowing through said separable contacts,
        a number of filter circuits cooperating with said number of alternating current sensors to output a number of alternating current signals,
        a number of peak detectors cooperating with said number of filter circuits to output a number of peak current signals, and
        a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
    wherein said processor further cooperates with said direct current sensor to cause said operating mechanism to trip open said separable contacts, and wherein said processor is further structured to detect a level shift in the sensed current employing said direct current sensor.

2. A direct current arc fault circuit interrupter comprising:
separable contacts;
an operating mechanism structured to open and close said separable contacts;
a trip circuit cooperating with said operating mechanism to trip open said separable contacts, said trip circuit comprising:
  a number of alternating current sensors structured to sense a current flowing through said separable contacts,
  a direct current sensor structured to sense the current flowing through said separable contacts,
  a number of filter circuits cooperating with said number of alternating current sensors to output a number of alternating current signals,
  a number of peak detectors cooperating with said number of filter circuits to output a number of peak current signals, and
  a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
  wherein said processor further cooperates with said direct current sensor to cause said operating mechanism to trip open said separable contacts, and
  wherein said processor is further structured to input a sensed direct current signal from said direct current sensor, and disable the number of filter circuits if a rate of change of the sensed direct current signal is greater than a first predetermined threshold or enable the number of filter circuits if the rate of change is less than a different second predetermined threshold, which is less than the first predetermined threshold.

3. A direct current arc fault circuit interrupter comprising:
separable contacts;
an operating mechanism structured to open and close said separable contacts;
a trip circuit cooperating with said operating mechanism to trip open said separable contacts, said trip circuit comprising:
  a number of alternating current sensors structured to sense a current flowing through said separable contacts,
  a number of filter circuits cooperating with said number of alternating current sensors to output a number of alternating current signals,
  a number of peak detectors cooperating with said number of filter circuits to output a number of peak current signals, and
  a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
  wherein the number of alternating current sensors is an alternating current sensor comprising a shunt in series with said separable contacts, a capacitor and a transformer including a primary winding and a secondary winding, the series combination of said capacitor and said primary winding being electrically connected in parallel with said shunt, the secondary winding outputting a sensed alternating current signal to said number of filter circuits.

4. The direct current arc fault circuit interrupter of claim 3 wherein said trip circuit further comprises a blanking gate controlled by said processor.

5. The direct current arc fault circuit interrupter of claim 3 wherein said number of filter circuits is a plurality of bandpass filter circuits, one for each of a plurality of different frequencies.

6. The direct current arc fault circuit interrupter of claim 3 wherein said number of filter circuits is a frequency agile filter circuit controlled by said processor; wherein said number of peak detectors is a peak detector cooperating with said frequency agile filter circuit to output a peak current signal; and wherein said processor is further structured to control the frequency agile filter circuit to determine the plurality of peak current signals, one for each of a plurality of different frequencies.

7. A direct current arc fault circuit interrupter comprising:
separable contacts;
an operating mechanism structured to open and close said separable contacts;
a trip circuit cooperating with said operating mechanism to trip open said separable contacts, said trip circuit comprising:
  a number of alternating current sensors structured to sense a current flowing through said separable contacts,
  a number of filter circuits cooperating with said number of alternating current sensors to output a number of alternating current signals,
  a number of peak detectors cooperating with said number of filter circuits to output a number of peak current signals, and
  a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
  wherein the number of alternating current sensors is a plurality of alternating current sensors, one for each of a plurality of different frequencies; wherein the number of filter circuits are operatively associated with the plurality of different frequencies; wherein the number of filter circuits are structured to provide said plurality of different frequencies having a predetermined frequency separation therebetween; and wherein said plurality of different frequencies are selected to avoid inverter noise.

8. A direct current arc fault circuit interrupter comprising:
separable contacts;
an operating mechanism structured to open and close said separable contacts;
a trip circuit cooperating with said operating mechanism to trip open said separable contacts, said trip circuit comprising:
  a number of alternating current sensors structured to sense a current flowing through said separable contacts,
  a number of filter circuits cooperating with said number of alternating current sensors to output a number of alternating current signals,
  a number of peak detectors cooperating with said number of filter circuits to output a number of peak current signals, and
  a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
wherein said number of filter circuits is a frequency agile filter circuit; wherein said number of peak detectors is a peak detector cooperating with said frequency agile filter circuit to output a peak current signal; and wherein said processor is further structured to control said frequency agile filter circuit to determine the plurality of peak current signals, one for each of a plurality of different frequencies.

9. The direct current arc fault circuit interrupter of claim 8 wherein said processor is further structured to eliminate a number of said plurality of different frequencies and to eliminate the same number of the plurality of peak current signals based upon a number of external noise sources.

10. A direct current arc fault circuit interrupter comprising:
separable contacts;
an operating mechanism structured to open and close said separable contacts;
a trip circuit cooperating with said operating mechanism to trip open said separable contacts, said trip circuit comprising:
  a number of alternating current sensors structured to sense a current flowing through said separable contacts,
  a number of filter circuits cooperating with said number of alternating current sensors to output a number of alternating current signals,
  a number of peak detectors cooperating with said number of filter circuits to output a number of peak current signals, and
  a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
wherein said arc fault circuit interrupter is one of a module protector for a direct current electrical generating module, a string protector, an array protector, a protector for a combiner box, a protector for a remote combiner box, a protector for an inverter, a protector for a converter, a protector for a module converter, a protector for a module junction box, a protector for a disconnect, and a protector for a circuit breaker.

11. The direct current arc fault circuit interrupter of claim 10 wherein said string protector is structured to detect and provide at least one of string performance information, string alarm information, and annunciation information.

12. A noise blanking circuit for a direct current arc fault circuit interrupter comprising separable contacts and a number of alternating current channels operatively associated with a plurality of alternating current signals for said separable contacts, said noise blanking circuit comprising:
  a direct current sensor structured to be in series with the separable contacts of said direct current arc fault circuit interrupter; and
  a processor cooperating with said direct current sensor, said processor being structured to input a sensed direct current signal from said direct current sensor, and disable the number of alternating current channels if a rate of change of the sensed direct current signal is greater than a first predetermined threshold or enable the number of alternating current channels if the rate of change is less than a different second predetermined threshold, which is less than the first predetermined threshold.

13. The noise blanking circuit of claim 12 wherein said processor is further structured to accumulate an average of the sensed direct current signal from said direct current sensor, determine if the number of alternating current channels are enabled, and responsively disable the number of alternating current channels if the averaged sensed direct current signal is less than a third predetermined threshold.

14. The noise blanking circuit of claim 12 wherein said processor is further structured to accumulate an average of the sensed direct current signal from said direct current sensor, determine if the number of alternating current channels are disabled, and responsively enable the number of alternating current channels if the averaged sensed direct current signal is greater than a fourth predetermined threshold, which is greater than the third predetermined threshold.

15. The noise blanking circuit of claim 14 wherein said processor is further structured to delay for a predetermined time after determining that the averaged sensed direct current signal is greater than the fourth predetermined threshold and before responsively enabling the number of alternating current channels.

16. A method of detecting arc faults of a direct current string, said method comprising:
  sensing an alternating current flowing through said direct current string;
  filtering the sensed alternating current with a number of filter circuits and outputting a number of alternating current signals;
  determining a plurality of peak current signals from the number of alternating current signals; and
  determining if the plurality of peak current signals exceed corresponding predetermined thresholds for a predetermined time, and responsively tripping said direct current string.

17. The method of claim 16 further comprising:
powering an inverter with said direct current string;
sensing the alternating current flowing through said direct current string with a number of current sensors;

employing a plurality of different frequencies operatively associated with said number of filter circuits and said plurality of peak current signals; and employing a capacitor disposed between said number of current sensors and said inverter to limit crosstalk between different direct current strings at the different frequencies.

18. A method of detecting arc faults of an array comprising a plurality of direct current strings electrically connected in parallel to form the array, said method comprising:
sensing an alternating current flowing through the array;
filtering the sensed alternating current with a number of filter circuits and outputting a number of alternating current signals;
determining a plurality of peak current signals from the number of alternating current signals; and
determining if the plurality of peak current signals exceed corresponding predetermined thresholds for a predetermined time, and responsively tripping the array.

19. The method of claim 18 further comprising:
powering an inverter with the array;
sensing the alternating current flowing through said array with a number of current sensors;
employing a plurality of different frequencies operatively associated with said number of filter circuits and said plurality of peak current signals; and
employing a capacitor disposed between said number of current sensors and said inverter to limit crosstalk between different ones of the direct current strings at the different frequencies.

20. The method of claim 18 further comprising:
employing as said corresponding predetermined thresholds three corresponding predetermined thresholds;
employing as said plurality of peak current signals three peak current signals; and
determining if all three peak current signals exceed the three corresponding predetermined thresholds for a predetermined time, in order to minimize nuisance trips when responsively tripping said one of said number of direct current strings.

21. The method of claim 18 further comprising:
adding a capacitor at an inverter to create a low impedance alternating current path for a predetermined frequency range.

22. The method of claim 18 further comprising:
identifying which of the plurality of direct current strings is faulted.

23. The method of claim 18 further comprising:
sensing a direct current flowing through the array; and
determining randomness in the sensed direct current and responsively tripping the array.

24. A direct current arc fault detector comprising:
a number of alternating current sensors structured to sense a current flowing through a conductor;
a direct current sensor structured to sense the current flowing through said conductor;
a number of filter circuits cooperating with said number of alternating current sensors to output a number of alternating current signals;
a number of peak detectors cooperating with said number of filter circuits to output a number of peak current signals;
an output; and
a processor cooperating with at least said number of peak detectors and said output, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively activate said output,
wherein said processor further cooperates with said direct current sensor to activate said output, and
wherein said processor is further structured to detect a level shift in the sensed current employing said direct current sensor.

25. A direct current arc fault circuit interrupter comprising:
separable contacts;
an operating mechanism structured to open and close said separable contacts;
a trip circuit cooperating with said operating mechanism to trip open said separable contacts, said trip circuit comprising:
an alternating current sensor structured to sense a current flowing through said separable contacts,
a broadband filter circuit cooperating with said alternating current sensor to output an alternating current signal,
a peak detector cooperating with said broadband filter circuit to output a peak current signal, and
a processor cooperating with at least said peak detector and said operating mechanism, said processor being structured to input and average the peak current signal and to determine if the averaged peak current signal exceeds a predetermined threshold for a predetermined time, and responsively cause said operating mechanism to trip open said separable contacts.

26. A direct current arc fault circuit interrupter comprising:
separable contacts;
an operating mechanism structured to open and close said separable contacts;
a trip circuit cooperating with said operating mechanism to trip open said separable contacts, said trip circuit comprising:
a number of alternating current sensors structured to sense a current flowing through said separable contacts,
a number of filter circuits cooperating with said number of alternating current sensors to output a number of alternating current signals,
a number of peak detectors cooperating with said number of filter circuits to output a number of peak current signals, and
a processor cooperating with at least said number of peak detectors and said operating mechanism, said processor being structured to input the number of peak current signals as a plurality of peak current signals or input the number of peak current signals and determine the plurality of peak current signals, said processor also being structured to determine if the plurality of peak current signals exceed corresponding predetermined thresholds for a predetermined time, and responsively cause said operating mechanism to trip open said separable contacts,
wherein said processor is a digital signal processor; wherein said digital signal processor is structured to process an analog current signal from the number of current sensors; and wherein said digital signal processor is further structured to determine a spectrum of the analog current signal using a fast Fourier transform to determine frequency content over a predetermined range of frequencies.

* * * * *